United States Patent
Mondello et al.

(10) Patent No.: US 12,072,380 B2
(45) Date of Patent: *Aug. 27, 2024

(54) JTAG REGISTERS WITH CONCURRENT INPUTS

(71) Applicant: Lodestar Licensing Group LLC, Evanston, IL (US)

(72) Inventors: Antonino Mondello, Messina (IT); Alberto Troia, Munich (DE)

(*) Notice: Subject to any disclaimer, the term of this patent is extended or adjusted under 35 U.S.C. 154(b) by 0 days.

This patent is subject to a terminal disclaimer.

(21) Appl. No.: 17/883,175

(22) Filed: Aug. 8, 2022

(65) Prior Publication Data

US 2022/0382485 A1 Dec. 1, 2022

Related U.S. Application Data

(63) Continuation of application No. 16/624,829, filed as application No. PCT/IB2019/000434 on May 31, 2019, now Pat. No. 11,408,935.

(51) Int. Cl.
| | |
|---|---|
| *G01R 31/3177* | (2006.01) |
| *G06F 3/06* | (2006.01) |
| *G06F 13/16* | (2006.01) |
| *G11C 29/14* | (2006.01) |
| *G11C 29/16* | (2006.01) |
| *G11C 29/32* | (2006.01) |

(52) U.S. Cl.
CPC ....... *G01R 31/3177* (2013.01); *G06F 3/0604* (2013.01); *G06F 3/0655* (2013.01); *G06F 3/0679* (2013.01); *G06F 13/1668* (2013.01); *G11C 29/14* (2013.01); *G11C 29/16* (2013.01); *G11C 29/32* (2013.01); *G11C 2029/3202* (2013.01)

(58) Field of Classification Search
CPC ............... G01R 31/3177; G06F 3/0604; G06F 3/0655; G06F 3/0679; G06F 13/1668; G11C 29/14; G11C 29/16; G11C 29/32; G11C 2029/3202
See application file for complete search history.

(56) References Cited

U.S. PATENT DOCUMENTS

| | | | |
|---|---|---|---|
| 5,898,704 A | 4/1999 | Kawano | |
| 6,067,262 A * | 5/2000 | Irrinki | G11C 29/12 365/201 |
| 6,122,762 A | 9/2000 | Kim | |
| 6,442,092 B1 * | 8/2002 | Tomita | G11C 16/102 365/219 |

(Continued)

OTHER PUBLICATIONS

International Search Report and Written Opinion for related PCT Application No. PCT/IB2019/000434, dated Feb. 12, 2020, 13 pages.

*Primary Examiner* — Cynthia Britt
(74) *Attorney, Agent, or Firm* — Brooks, Cameron & Huebsch, PLLC

(57) ABSTRACT

The present disclosure relates to an apparatus comprising a host device and a memory component coupled to the host device. The memory component can comprise an array of memory cells, and an interface comprising a boundary scan architecture, wherein the boundary scan architecture includes an instruction register configured to store data indicative of a presence of a test data input (TDI) signal.

19 Claims, 14 Drawing Sheets

(56) References Cited

U.S. PATENT DOCUMENTS

| | | | |
|---|---|---|---|
| 7,685,380 B1 * | 3/2010 | Khu | H03K 19/1776 711/102 |
| 2003/0163773 A1 | 8/2003 | O'Brien | |
| 2006/0195739 A1 | 8/2006 | O'Brien | |
| 2009/0089632 A1 * | 4/2009 | Morein | G11C 29/14 714/719 |
| 2009/0249136 A1 | 10/2009 | Halstvedt | |
| 2020/0064405 A1 | 2/2020 | Srinivasan | |

* cited by examiner

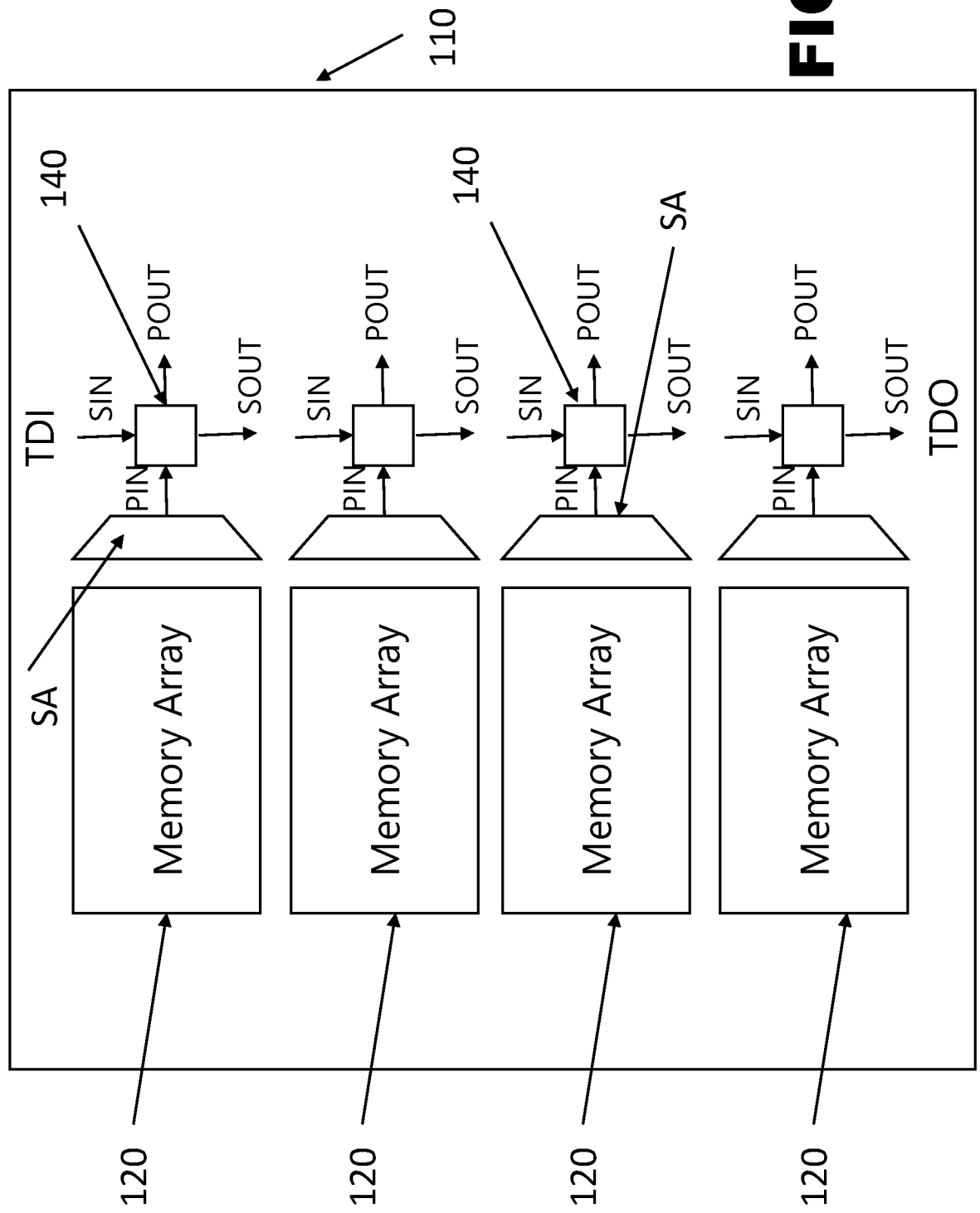

JTAG REGISTERS WITH CONCURRENT INPUTS

PRIORITY INFORMATION

This application is a Continuation of U.S. application Ser. No. 16/624,829, filed on Dec. 19, 2019, which is a National Stage Application under 35 U.S.C. § 371 of International Application Number PCT/IB2019/000434, filed on May 31, 2019, the contents of which are incorporated herein by reference.

TECHNICAL FIELD

The present disclosure relates generally to memory devices, and more particularly, to apparatuses and methods for non-volatile memory management. More particularly, the present disclosure relates to a JTAG based architecture allowing multi-core operation as well as an improved managing of the inputs in a non-volatile memory device.

BACKGROUND

Non-volatile Flash memories are today one of the fundamental building blocks in modern electronic systems, particularly for Real Time Operating Systems (RTOS) that require a high parallelism in managing data. Generally, the operation of the non-volatile Flash memories is managed by an internal controller including an embedded firmware, such controller performing the required write/read/erase operations.

The performances of Flash memories in terms of speed, consumption, alterability, nonvolatility and the increasing importance of system reconfigurability have pushed for their integration in System-on-Chip (SoC) devices. However, there are several non-volatile technologies used in SoC but the programming methodologies are requiring more space and the software is complicated in comparison to the past to full fill new regulations, for instance for regulated markets. In other cases, an easy technique to program forcing to generate bigger libraries with already developed functions, this libraries being downloaded in the hardware even if they are not used. This drawback is pushing toward the search of having more storage space with difficulties in integrating such a storage space in a SoC.

A SoC is a semiconductor integrated circuit that integrates all components of a computer or other electronic systems. These components typically include a central processing unit (CPU), SoC controllers, memory portions, input/output ports and secondary storage components, all on a single semiconductor substrate. A SoC may contain digital, analog, mixed-signal, and often radio frequency signal processing functions, depending on the application. As they are integrated on a single electronic substrate, a SoC device may consume much less power and take up much less area than multi-chip designs with equivalent functionality. SoC devices are nowadays very common in the mobile computing, in embedded systems and in the Internet of Things (IoT).

The non-volatile memory portions embedded in System on Chips, namely eFlash, is more and more difficult to be managed when the lithography node is below 28 nm. The increase demand of on-board memory in SoC is touching a physical limit and with the current technologies it is no longer convenient to use eFlash components with a size getting closer to that physical limit.

Therefore, there is a need for providing a new architecture of memory components and a corresponding need to define new interfaces for communicating with a SoC improving at the same time the performances of the non-volatile memory portion while having a low initial latency in the first access and improving the overall throughput.

BRIEF DESCRIPTION OF THE DRAWINGS

FIG. 3A shows a schematic view of a memory block of the non-volatile memory component of FIG. 2 including a layout configuration according to the present disclosure;

DETAILED DESCRIPTION

With reference to those figures, apparatuses and methods involving a non-volatile memory device 1 or component and a host device 10 for such a memory device will be disclosed herein.

Figure 1:
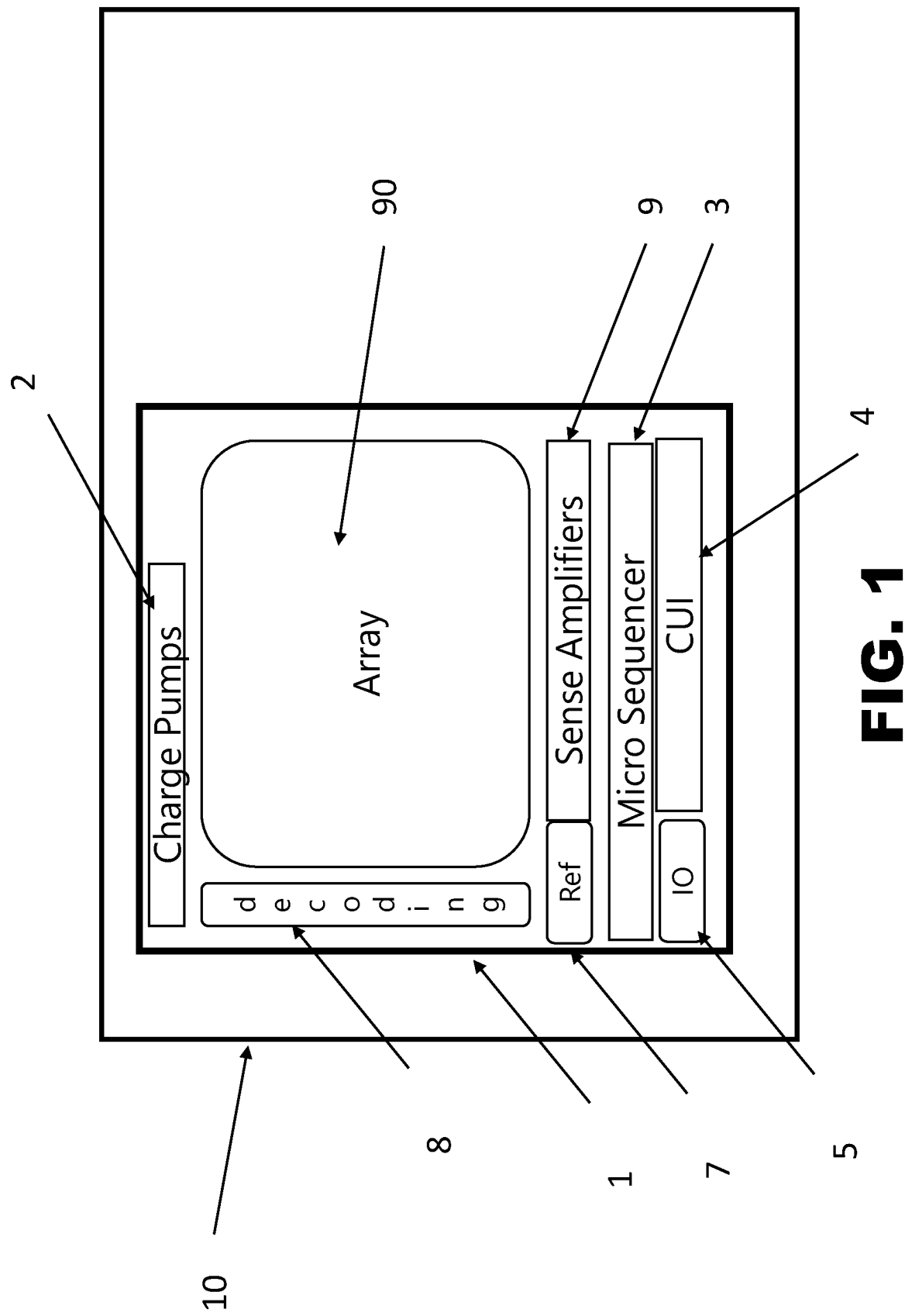
FIG. 1 shows a schematic view of a host device, for instance a System-on-Chip, coupled to a non-volatile memory component according to embodiments of the present disclosure.

The host device 10 shown in FIG. 1 can be a System-on-Chip with an embedded memory component 1 or a more complex electronic device including a system coupled to a memory device, as will appear from the description of other embodiments of the present disclosure made with reference to other figures. In any case, the System-on-Chip 10 and the memory device 1 are realized on a respective die obtained by a different lithography process. As an alternative, the system 10 may be an external controller in communication with the System-on-Chip but for the purpose of the present disclosure we will refer to the host device or to the SoC as entities in communication with the memory component.

For instance, the system 10 can be one of a number of electronic devices capable of using memories for the temporary or persistent storage of information. For example, a host device can be a computing device, a mobile phone, a tablet or the central processing unit of an autonomous vehicle.

According to embodiments of the present disclosure the size of the memory component 1 has been improved. The memory component of the present disclosure is a non-volatile memory device 1 that has been realized as an independent die with a specific lithography process dedicated to the manufacturing of flash memory devices and may be coupled to the host device 10 or to a System-on-Chip though a communication channel.

The memory component 1 is an independent structure but it is strictly associated to the host device or to the SoC structure. More particularly, the memory device 1 is associated and linked to the SoC structure partially overlapping such a structure while the corresponding semiconductor area of the SoC structure has been used for other logic circuits and for providing support for the partially overlapping structurally independent memory device 1 for instance through a plurality of pillars or other similar alternative connections such as bumping balls or with a technology similar to Flip-Chip.

The final configuration will be a face-to-face interconnection SoC/Flash Array with the sense amplifiers will be connected to the SoC in a Direct Memory Access configuration. In this manner it is possible to keep relatively low the number of required interconnections, in particular only by way of an example of this implementation within the range of about 600 to 650 pads.

The memory component 1 is structured as a single independent die with corresponding interconnecting pads for a communication channel with the SoC; however, the memory component may be structured as a stack of memory dies interconnected in a single device package, in such a case a wireless intra-dice communication is provided.

More specifically, this non-volatile memory component 1 includes an array 90 of Flash memory cells and a circuitry located around the memory array. The coupling between the SoC structure 10 and the memory component 1 is obtained by interconnecting a plurality of respective pads 250 or pin terminals that are faced one toward the other in a circuit layout that keeps the alignment of the pads even if the size of the memory component is modified.

In one embodiment of the present disclosure, the arrangement of the pads 250 of the memory component has been realized on a surface of the memory component 1, in practice on the top of the array. More specifically, the pads are arranged over the array so that, when the memory component 1 is reversed, its pads are faced to corresponding pads of the host or SoC structure 10. The schematic view of FIG. 2 do not represent in scale the position and location of the pads 250 but it is just indicative. Moreover, just a reduced number of pads 250 is illustrated.

Even a memory component of a larger size may be supported and interconnected with the pads of the SoC structure, keeping the position and dislocation of its interconnecting pads.

At the end, the memory device 1 is manufactured according to the user's needs in a range of values that may vary according to the available technology, for instance only by way of an example of this implementation from at least 128 Mbit to 512 Mbit or even more without any limitation for the applicant's rights. More specifically, the proposed external architecture allows to overpass the limit of the current eFlash (i.e. embedded flash technology) allowing the integration of bigger memory, as it can be, still only by way of an example of this implementation, 512 Mbit and/or 1 Gbit and/or more depending on the memory technology and technology node.

The memory device 1 may have a size that is different if compared with the size of the SoC structure to which it is associated, such a size can be minor or greater. Referring to the term "partially overlapping" previously used, we intend that the memory device 1 covers partially or not completely the area of the SoC structure, or viceversa.

With more specific reference to the example of FIG. 1, the main structure of the memory component 1 according to an embodiment of the present disclosure will be disclosed.

The memory component 1 includes at least: an I/O circuit 5, a micro-sequencer 3, an array of memory cells 90, voltage and current reference generators 7, charge pumps 2 and decoding circuitry 8 located at the array periphery, sense amplifiers 9 and corresponding latches, a command user interface, for instance a CUI (Command User Interface) block 4.

The array of memory cells 90 includes non-volatile Flash memory cells. The cells can be erased in blocks instead of one byte at a time. Each erasable block of memory comprises a plurality of non-volatile memory cells arranged in a matrix of rows and columns. Each cell is coupled to an access line and/or a data line. The cells are programmed and erased by manipulating the voltages and timing on the access and data lines.

To read the memory cells of the Array 90 it is provided a dedicated circuit portion including an optimized Read Finite State Machine that is used to ensure high read performance, such as: branch prediction, fetch/pre-fetch, interrupt management, and so on.

In one embodiment of the present disclosure shown schematically in FIG. 3A the memory array 90 is built as a collection of sub arrays 120. Each sub array 120 is independently addressable inside the memory device 100. Each sub-array 120 contains multiple memory blocks.

In this manner, having smaller sectors if compared to known solutions the access time is significantly reduced and the whole throughput of the memory component is improved. The reduction of the initial latency time is at block level because the row and column lines, the read path associated latency and the external communication have been optimized.

In the embodiments disclosed herewith the memory array 90 is structured with a number of sub-arrays 120 corresponding to the number of cores of the associated SoC and, therefore to the number of corresponding communication channels. For instance, at least four memory sub arrays 120 one for each communication channel with a corresponding core of the SoC 10 are provided.

The host device or the System-on-Chip 10 normally includes more than one core and each core is coupled to a corresponding bus or channel for receiving and transferring data to the memory component 1.

Therefore, in the present implementation each sub-array 120 has access to a corresponding channel to communicate with a corresponding core of the System-on-Chip 10. The advantage of this architecture is that it is very scalable, wherein expanding and/or reducing the density of the final device translates only in minoring and/or increasing the number of blocks of each subarray, that is the available density per core.

In embodiments of the present disclosure each independently addressable location of the blocks of each memory sub array 120 addresses an extended page. A couple of extended pages will be defined as "super page".

The internal sense amplifiers 9 are preparing two pages of at least 168 bits (i.e. 128 Bits plus the safety data, in particular address and ECC bits), and while the first page is ready to be shifted, internally it is performed a further read operation of a second page associated with the same address. This allows to prepare from five to eight double word, that are typical in the RTOS application allowing the sense amplifiers to execute a further internal read operation to prepare the second nibble or group of 128 Bits, if the system is structured with two pages, for instance of 128 Bits, more particularly of 168 Bits when including safety data.

As non-limiting example, this extended page comprises a string including a first group of at least one-hundred-twenty-eight (128) Bit for the I/O data exchange with the SoC device 10 plus at least a second group of twenty-four (24) address Bit and a final or third group of at least sixteen (16) ECC Bit. The twenty-four (24) address Bit are sufficient to address up to 2 GigaBit of available memory space.

According to the present disclosure, the outputs of the sense amplifiers SA prepare a double extended page at a time, i.e. a super-page comprising a number of Bits given by the double combination of the above-mentioned three groups of data bits, address bits and ECC bits, according to the size of the memory array.

In the specific but non-limiting example disclosed herewith each extended page includes at least 168 Bit obtained by the combination of the above three groups of 128+24+16 data, address and ECC Bit and each super-page is formed by a couple of extended pages, i.e. a group of 168 Bits×2.

Just to give a non-limiting numeric example, each row of a memory block includes sixteen extended pages. Therefore, the resulting row includes 2688 Bit coming out from the combination of sixteen extended pages independently addressable and each including 168 Bit or, said differently, the combination of eight super-pages.

In embodiments of the present disclosure the output of a generic sub-array 120 is formed combining the following sequence: data cells plus address cells plus ECC cells. In this non-limiting example the total amount of Bits would involve 168 pads per channel, as shown in FIG. 3B.

The combined string of data cells+address cells+ECC cells allows implementing the whole safety coverage of the bus according to the standard requirements, because the ECC covers the whole bus communication (data cells+ address cells), while the presence of the address cells provide the confidence that the data is coming exactly from the addressed location of the controller.

The sense amplifiers SA of each sub array 120 are connected with a scan-chain of modified JTAG cells 140, connecting together all the output of one sub-array 120. Moreover, the modified JTAG cells 140 associated to a sub array 120 can be interconnected to form a unique chain for quickly checking the integrity of the pads interconnections.

Thanks to the memory architecture of the present disclosure it is possible to pass from a parallel mode for retrieving data and addresses from the memory sub arrays 120 to a serial mode for checking the interconnections between the memory component 1 and the associated SoC device 10. Moreover, the SoC is entitled to read once '1' and once '0' to perform tests and can also analyze the memory outcome, scanning out the data using the scan-chain.

It should be further noted that each subarray 120 includes address registers connected to data buffer registers, similarly to an architecture used in a DRAM memory device, i.e. as DDRx in 3DXP or as LPDDRx.

The error correction is left, as operation, to the SoC 10; the additional bits are provided to the controller to store any possible ECC syndrome associated with the page. The ECC cells allows the SoC controller to understand if corruption is happening in the data plus address content.

To write and erase the memory cells of the Array 90 it is provided a dedicated logic circuit portion including a simplified Reduced Instruction Set Computer (RISC) controller or a Modify Finite State Machine or that is the logic circuit for handling the programming and erasing algorithms.

In one embodiment of the present disclosure, the memory component 1 implements a Direct Memory Access type of memory to replace the embedded memory array of known SoC devices.

Moreover, a JTAG interface 210 is adopted as regular user interface to modify the array and provide the read addresses to the memory blocks. The JTAG interface 210 is used also for the test of the memory component 1, allowing the re-use of the testing tooling. Therefore, the memory component 1 also comprises a JTAG logic.

The memory component 1 uses high speed interconnection pads 250 and the logic circuit portion to allow the interconnection with the SoC structure 10.

The final configuration will be a face-to-face interconnection SoC/Flash Array, wherein the sense amplifiers 9 of the memory component 1 will be connected to the SoC in a Direct Memory Access configuration.

The Direct Memory Access allows to reduce the final latency that the SoC can experience when reading the data. Moreover, the final latency is also reduced by the block form factor, the sense amplifiers distribution between blocks, the selection of the comparison threshold in the sense amplifiers and the optimized path.

The interconnections also include the JTAG interface 210 and control pins for testing and other purposes. The core of the SoC device 10 can have access to the JTAG interface 210 by using some internal pads 270. Such pads are high speed and have the capability to support the maximum frequency. More specifically, high speed pads 250 are used in the fast read path versus the SoC, while a low speed path is dedicated to the testing phase. The JTAG cells are part of the fast path, but the JTAG interface is using the slower path.

According to the present disclosure, the memory component 1 is equipped with a controller 230 of the flash array 90 (hereinafter referred to as Flash array controller). The flash array controller 230 has an architecture that allows using some flash array resources with the SoC controller without compromising the secrecy of certain information stored therein (for example, algorithms, flash array voltages, currents, and more in general process information) and guarantees eventual customer return management. This is allowed by the adoption of a special structure wherein the user can write his own firmware in a first area and can interact with the controller internal firmware in a second different area.

Moreover, a boundary-scan architecture 260 is provided for the testing and for the managing the memory array read registers.

One embodiment of the present disclosure relates to an apparatus comprising:
- a host device or a System-on-Chip:
- a memory component having an independent structure and including at least an array of memory cells organized in sub-arrays with associated decoding and sensing circuitry;
- a JTAG interface in said at least an array of memory cells including a boundary-scan architecture;

an instruction register in said boundary-scan architecture of the JTAG interface including at least a couple of Bits indicative of the presence of a Test Data Input (TDI) signal.

Moreover, at least a data register is also loaded in parallel with said instruction register.

The JTAG interface is a Finite State Machine FSM controlling the operation steps of the boundary scan architecture and including said instruction register loaded in a single clock cycle.

The content of the present disclosure makes reference to memory array including a plurality of sub-arrays 220 and a plurality of memory blocks in each sub-array. Moreover, a plurality of extended pages is independently addressable in each block and each extended page includes a group of data, address and ECC Bit. The extended page including said group of data, address and ECC Bit comprises at least 168 Bit.

More specifically, the architecture of a memory block comprising each location of the memory array may be defined as extended page. An extended page includes 128 bit I/O needed for the SoC and a 16 bit of ECC involving 24 bit addressing (up to 2 G bit of available space).

Said differently, the atomic page of 128 bits used in each sub-array 220 to fill the communication channel with the SoC device has been enlarged in the present implementation to contain the stored address and the ECC.

Each memory block contains at least 256 rows and each row includes sixteen extended pages of the above size. Each extended page includes at least 168 Bits as a combination of data, addressing and ECC Bits. Therefore, each row of the memory array can contain up to sixteen double words of 32 bits each, plus the address and ECC bits per page. As already indicated, a resulting row including 2688 Bit comes out from the combination of sixteen extended pages independently addressable and each including 168 Bit and thus the combination of eight super-pages.

Just to give a numeric value, an extended page is formed by 128+16+24=168 Bits and sixteen extended pages per each row comprise 168*16=2688 bits.

Therefore, each row of a memory block includes at least sixteen pages comprising a memory word plus the corresponding address Bits and the corresponding ECC Bits. Obviously, another size can be selected and the reported value are just for illustration purpose of a non-limiting example. The outcome of the blocks is driven directly by the host device or SoC 10 without using high power output buffers of the known solutions and optimizing the path thanks to the modified and optimized JTAG interface 210.

Figure 2:
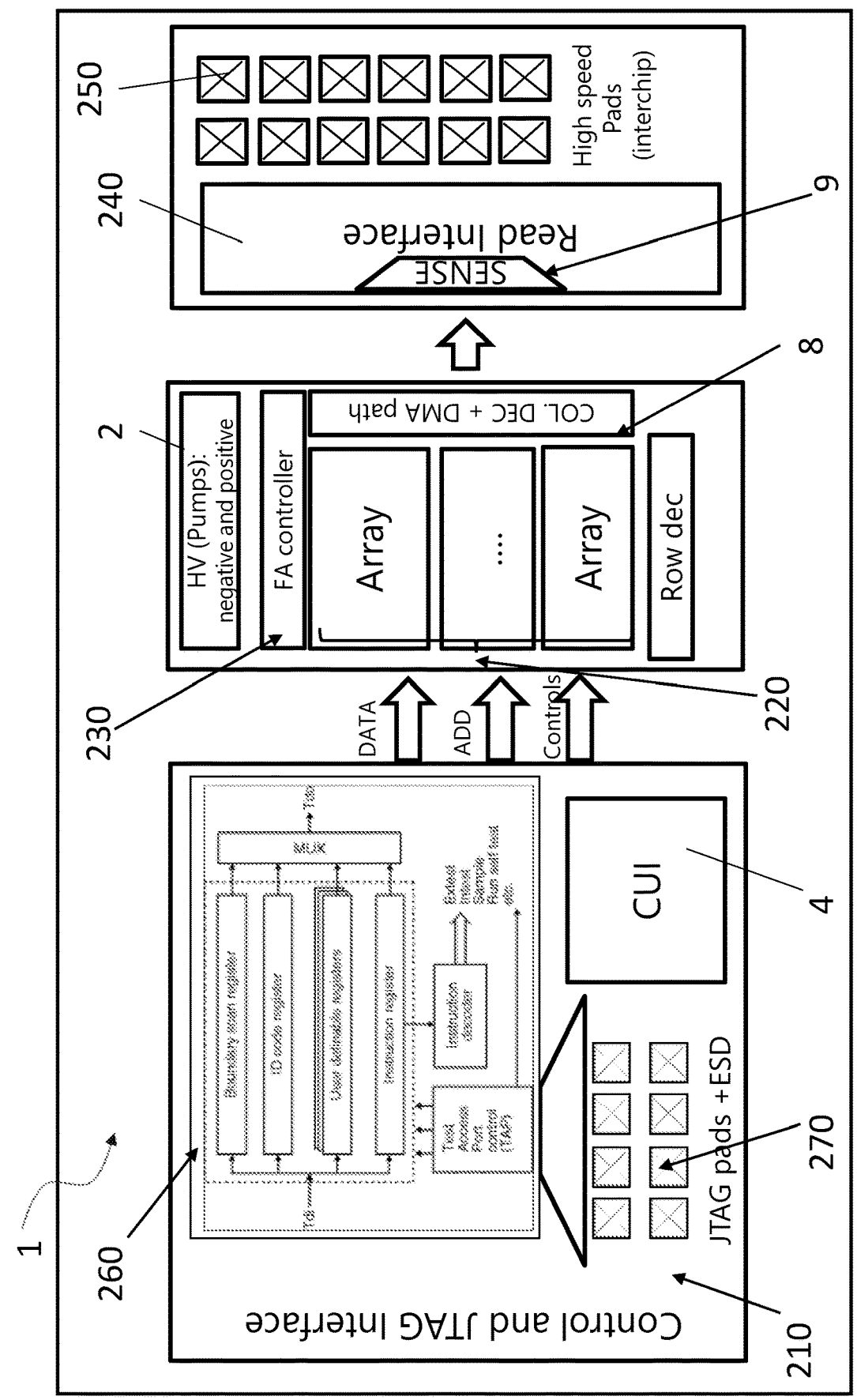
FIG. 2 is a schematic view of the memory component according to the present disclosure.

Again, with reference to FIG. 2, the outputs of the sense amplifiers SA per sub array 220 are latched by an internal circuit of a read interface 240. The memory structure can be expanded to allow multi-page read while shifting out the already read page.

The sense amplifiers SA are connected directly to a modified JTAG cells, that will be later disclosed, so to integrate a JTAG structure and the sense amplifiers in a single circuit portion. This allows reducing as much as possible the delay in propagating the output of the memory array to the SoC.

As previously said, the internal sense amplifiers 9 are preparing two pages of at least 128 bits and while the first page is ready to be shifted, internally it is performed a further read operation of a second page associated with the same address. This allows to prepare from five to eight double word of 32 bits each, that are typical in the RTOS application allowing the sense amplifiers to execute a further internal read operation to prepare the second nibble or group of 128 Bits, if the system is structured with two pages of 128 Bits. This is the reason for having chosen an extended page of 2×128 bits plus corresponding addresses and ECC Bits. This second part of four double words is transferred to the output of the flash array 90, using an additional enabling signal (i.e. an internal clock signal or an ADV signal) that transfers the content read at sense amplifier level to the host device or SoC device 10. The signal names are load_data [0, 1] . . . there is no need of incrementing the address when using the extended page. More particularly, load_data[1:0] is linked to an address indicating which portion of the data is needed by the SoC.

Figure 3:
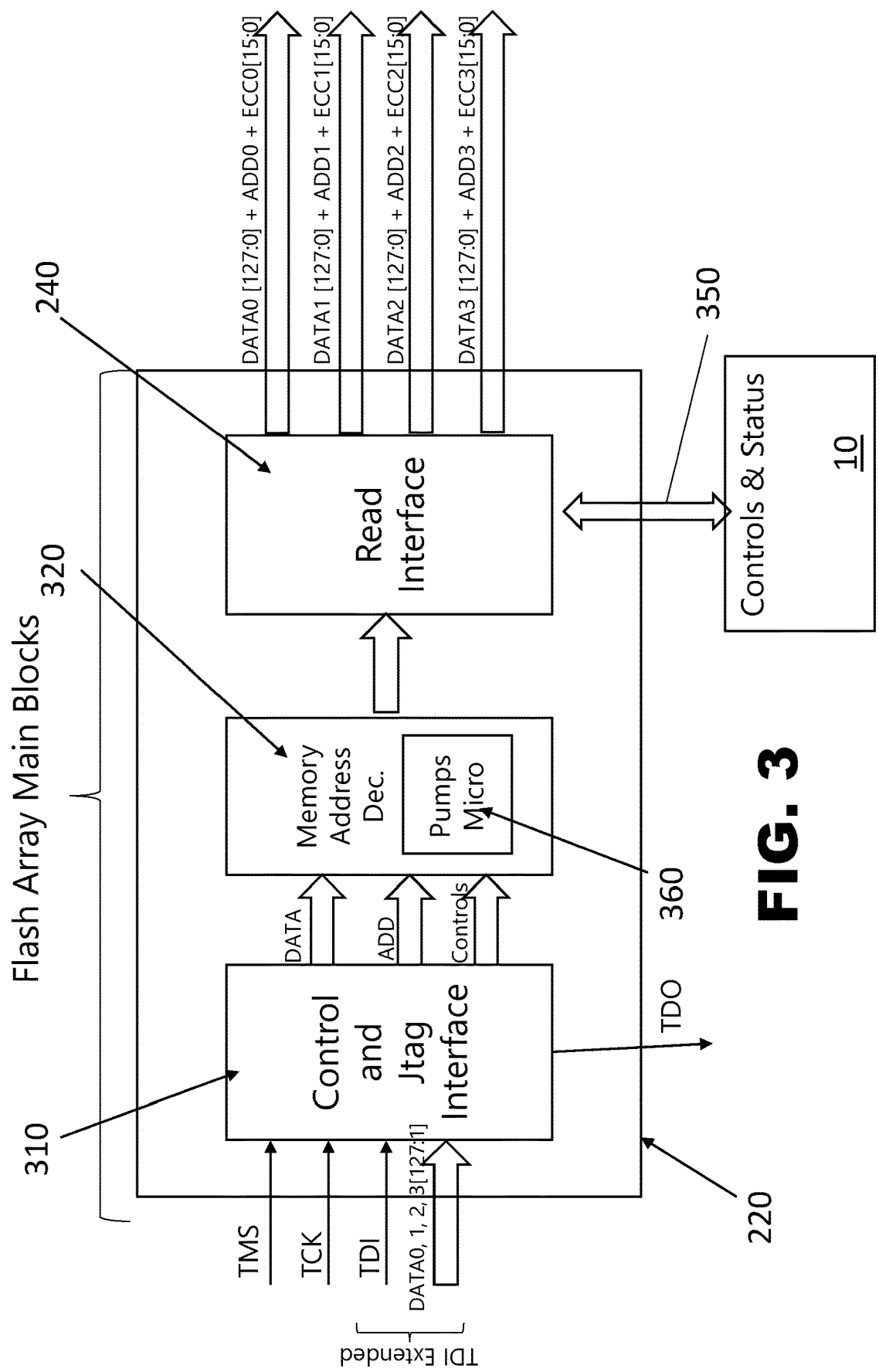
FIG. 3 is a schematic view of the internal layout of the non-volatile memory component of FIG. 1 according to one embodiment of the present disclosure.
Figure 3B:
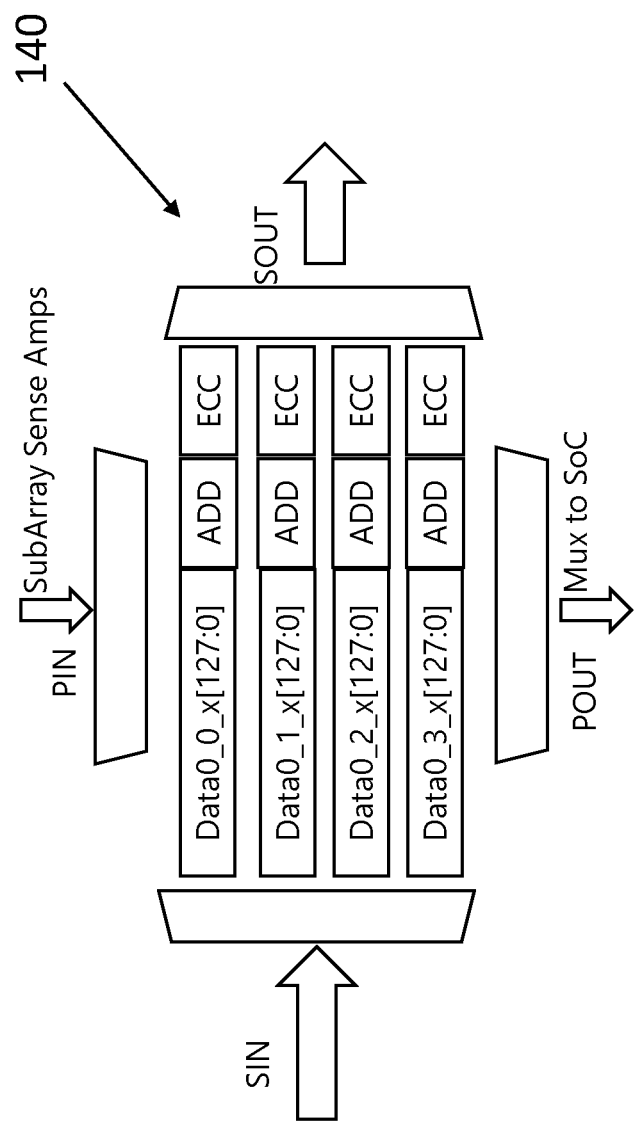
FIG. 3B is a schematic view of a group of address registers for a memory page in the memory component of the present disclosure.
Figure 3C:
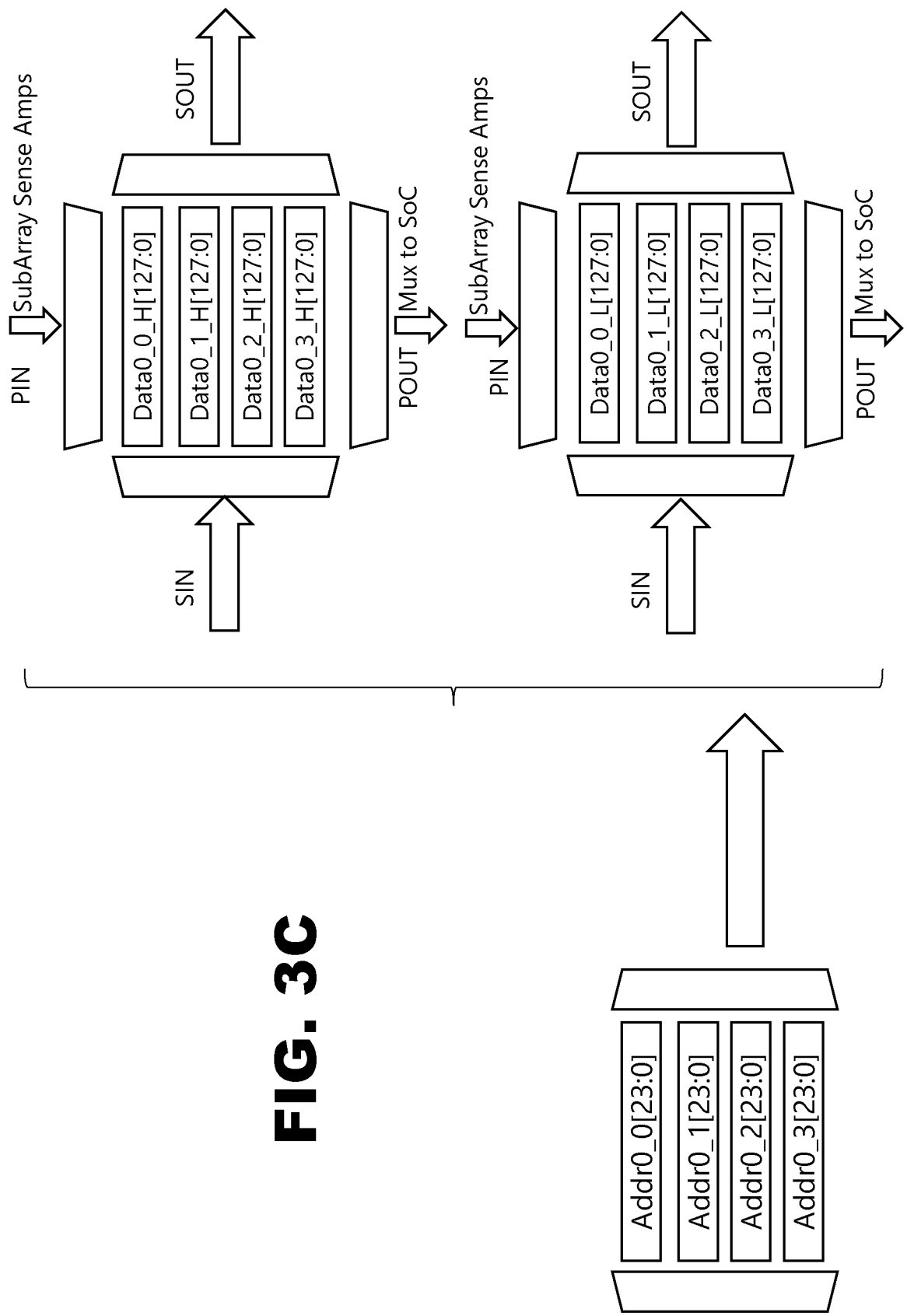
FIGS. 3C and 3D show schematic schemes for row data buffers and corresponding row address buffers adopted for the memory device of the present disclosure.

So, making now reference to the example of FIG. 3C, if the SoC 10 needs up to 256 Bits at a time without considering the address and ECC Bits, the data buffers will be duplicated so to be able to shift, assuming to use the address 0 of the sub array 0:

First pass of the first group of Bits: Data 0_0_H [127:0]+ Add Bits+ECC

Second pass of the second group of Bits: Data 0_0_L [127:0]+Add Bits+ECC.

This selection is made using load_data[1:0] as a selector of the high page or the low page.

The address buffers are made using JTAG Cells, as will be later explained.

According to the standard IEEE 1149 and 1532 concerning the JTAG, the protocol IEEE1532 is used as expanded command set to operate in each sub array.

Figure 3D:
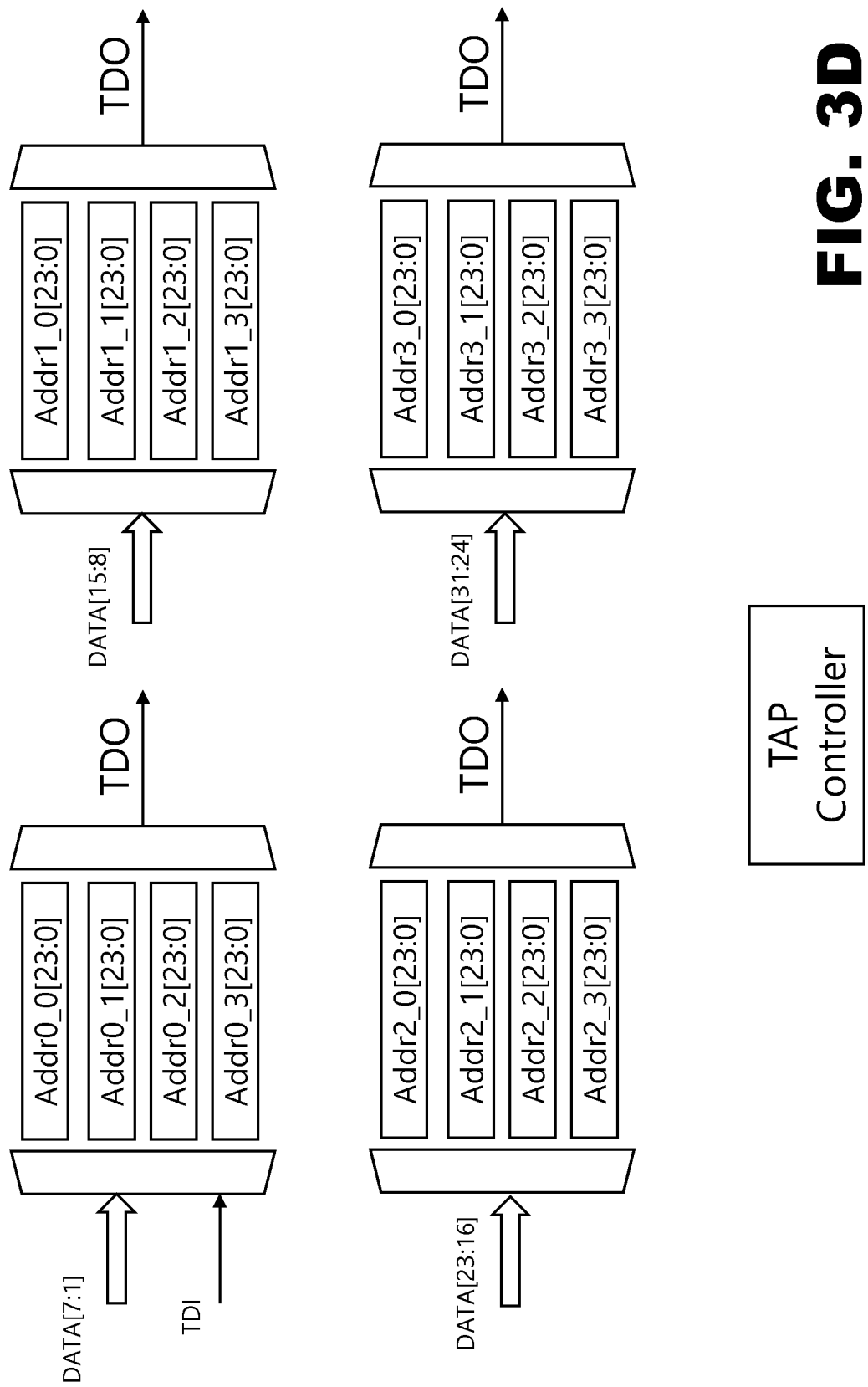

The need of having a very low initial latency and high throughput is driving the generation of the following scheme for the addressing per sub-array. FIG. 3D shows row address buffers and the corresponding row data buffers in the structure similar to DRAM but here we have adopted the super pages addresses and corresponding data, i.e. 168×2.

The set of instructions to address the memory implemented can be of two types:

Global address loading: in this case all the sub array will receive the address in multiple steps using a command, i.e. load_global_address_0, load_global_address_1, etc.

Local address loading: in this case only the addressed register in the selected sub-array will receive the new address, i.e. local_address_0_0, local_address_0_1, local_global_address_1_3, etc.

Each sub-array will contain a set of 4× data registers, for instance 2×(4×(data+address+ECC registers)) corresponding each to an address register. 4× data registers are containing a super page, that is to say: data_H+data_L, where data_H and data_L are the higher and lower portions of data, respectively. In other words, they are the data portions sequentially loaded, e.g., from first extended page and second extended page forming together the so-called super page, for example.

The address register is connected with the TDI (Test Data In) when a global and a local address are properly latched using a proper Jtag sequence, namely: loading the global address command in the IR, then loading the sub array address, then loading as instruction the local address command, loading the address of the extended page to be read, then loading the read command, followed by the run/testidle to execute the read from the selected location.

According to the present disclosure, the loading of the registers happens one by one, the flexible TDI increases the size of the admissible number of bits, depending on the kind of register: instruction register (4 bits at a time), address (8 bits), data (128 bits), etc. up to use the whole data lines width. In other words, the flexible TDI is register dependent, the only constraint being in the IR where the JTAG standards dictate the minimum of two clock cycles to load instruction. On the contrary, the TDO is always single bit.

A Global_Address_Loadx command is used to load at the same time the nibble of eight bits in the corresponding registers:

Global_Address_Load0 in the instruction register generates the load of the addr0_0. This command, for example, can address the sub array 0; similarly, it happens for the selection of the corresponding sub array address registers, addr1_0, addr2_0 and addr3_0 using three TCK cycles when the finite state machine of the JTAG interface is in the Shift_DR state.

Local_Address_Load0_0 in the instruction register generates the load of the addr0_0, using three TCK cycles when the finite state machine is in the Shift_DR state. This command, as example, addresses the register 0 of the selected subarray. This means that when the ShiftDR is reached the TDI is connected to the input of this shift register and the TDO to the output, if the flexible TDI is used we need only three clock periods Tck to have the whole address inside the selected address register, otherwise we would need 24 clock periods Tck.

These instructions (Global_Address_Load0, Global_Address_Load1, Global_Address_Load2, Global_Address_Load3) allow the pre-load of the address for all the channels implemented in the flash array. Those four instructions are implemented to select one of the four sub array. In a possible implementation with eight cores, we will need eight commands, one for each core or a method to select one of the cores using one command and a sub array address. Therefore, the introduction of the above command permits to optimize the communication between the SoC structure 10 and the memory component 1 enhancing the transfer performance to the controller.

The instructions (Local_Address_Load0_0, . . . , Local_Address3_3) allow the use of a single core/channel avoiding the need for the controller to manage the whole set of cores when only one is working. These instructions serve for selecting one of the address register of the selected sub-array.

The scan-chains of the JTAG cells at the output of each sense amplifier 9 of each sub array 220 are connected together to form a unique shift register to proper test the above-mentioned interconnections, as will be disclosed in more details later on.

This architecture is very scalable and expanding and/or reducing the density of the final device translated only in mirroring and/or increasing the number of blocks of each sub-array 220 in a very scalable manner.

FIG. 3 shows a schematic view of the main components of the non-volatile memory component 1 of the present disclosure.

As we have previously seen, each sub-array 220 is coupled to the SoC device in a Direct Memory Access manner. A JTAG TAP is unique per flash array and is part of the JTAG interface 210 that is the user and test mode interface of the device. A modified JTAG cell is used to reduce the path for the SoC active when the fast output is used with the SoC.

The JTAG interface 210 receives as inputs standard JTAG signals: TRST, TCK, TDI as well as data from a memory page of 128 Bits.

According to embodiments of the present disclosure, an extended TDI is used as flexible TDI. The flexibility is due to the fact that the number of parallel bits working as TDI are depending from the selected registers, for instance four lines for the instruction register, eight lines for the address register and 128 lines for the data register, and so on.

So, the signal TDI comes from the JTAG protocol that uses TDI as name on the signal used to fill the registers but the present disclosure uses an extended TDI since the common input signal of a normal JTAG interface have been expanded to include also further input/output pads for corresponding signals: T_Busy, T_Analog, T_TestRun.

The JTAG loaded registers produces as output data, addresses and control signals that are transferred to the internal flash controller 230 to perform modify operations to the selected area of the sub array 120. More specifically, the address decoder 320 drives the selection of the row and column that are driven by the output of the charge pumps. the charge pumps will provide the proper voltage when needed to perform the various operations, i.e. program, read, erase to the selected area of the sub array.

The activity of the decoder is allowed by charge pumps 360 structured to keep secret the voltages and timings to manage the array; these features are handled by the firmware of the Flash controller 230 and the pumps are receiving a target voltage from the flash controller.

This decoder 320 addresses the selected memory block. The address decoder 320 is connected to the array to select the proper data lines, i.e. row and column for each super page, the read, modify and any other operations are using the address decoder to properly address bytes in the memory array.

A memory block is connected to the sense amplifiers and the sense amplifiers of the read interface 240 are connected to the SoC device 10 using the modified JTAG cells. The communication channel between the flash array blocks and the SoC device 10 is represented by a control and status bus 350.

The output of the read interface 360 is represented by the series of 168 Bit for each sub array 220 that has been disclosed previously.

The implementation of this mechanisms is one of the components of the performed optimization activity on the disclosed device and has an impact on the high throughput thus ensuring the optimization of the read operation of the memory array.

Figure 4:
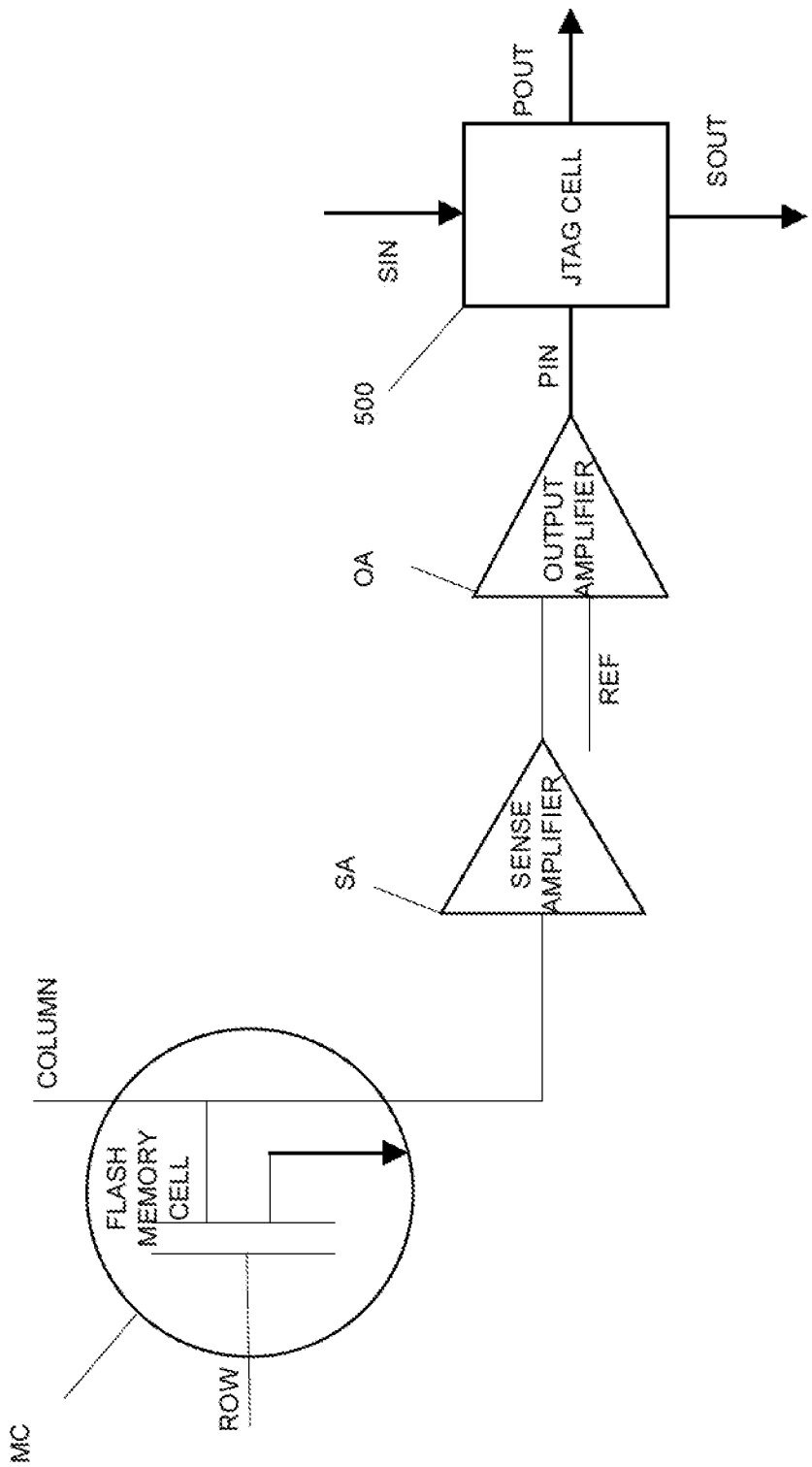
FIG. 4 is a schematic view of the connections between a generic memory cell and a corresponding sense amplifier with the inclusion of the modified JTAG cell according to the present disclosure.

FIG. 4 shows a schematic view of a generic column of the memory sub-array including at least a memory cell MC coupled to a sense amplifier SA. Obviously, the column has a plurality of cells, like MC and this Figure shows a generic whole path from the storage cell to the core input.

The sense amplifiers SA of the memory sub-array are connected directly to a modified JTAG cells 500, that will be later disclosed with reference to FIG. 5, so to integrate a JTAG structure and the sense amplifiers in a single circuit portion. This allows reducing as much as possible the delay in propagating the output of the memory array to the SoC.

The sense amplifiers SA of each sub array 220 are coupled to the modified JTAG Cell 500 in the manner shown in FIG. 4, even if other less important circuits are not shown.

PIN: from the output of a sense amplifier (or from the output buffer downstream the sense amplifier)
POUT: to the SoC corresponding Data I/O
SIN: is the serial IN input connected to the SOUT of the previous modified JTAG cell
SOUT: is the serial output connected to the SIN of the next JTAG cell.

The scan chain formed by serially the interconnected JTAG cells 500, using the serial input and output, has some advantages:

be able to test the successful interconnection between the SoC and the Direct Memory Access (DMA) Memory;

be able to implement digital test of the sense amplifiers, because the cell can work as program load to store the data inside the array;

be able to work as second level of latches.

The sense amplifier SA is coupled to the column of memory cells as part of the read circuitry that is used when a data is read from the memory array. Generally speaking an extended page of 168 plus 168 Bits, as a combination of data, addressing and ECC Bits, is read in a couple of clock pulses.

As is well known, the role of the sense amplifier is that of sensing the low power signals from the array row. The low voltage values representing the logic data Bit (1 or 0, depending on conventions) stored in the memory cell MC are amplified to a recognizable logic level so the data can be properly interpreted by logic circuit portions outside the memory.

In the example disclosed herewith the output of each sense amplifier SA is coupled to the modified JTAG cell 500 so to integrate a JTAG structure and the sense amplifier.

Thanks to the memory architecture of the present disclosure it is possible to pass from a parallel mode for retrieving data and addresses from the memory sub arrays 220 to a serial mode for checking the interconnections between the memory component 1 and the associated host device 10 further analyzing the memory outcome, scanning out the data using the scan-chain formed by the modified JTAG calls.

The transition from the parallel to the serial mode is managed by the JTAG interface 210. However, the implementation of these dual mode operations is allowed by the specific structure of a modified JTAG cell 500 disclosed hereinafter.

Figure 5:
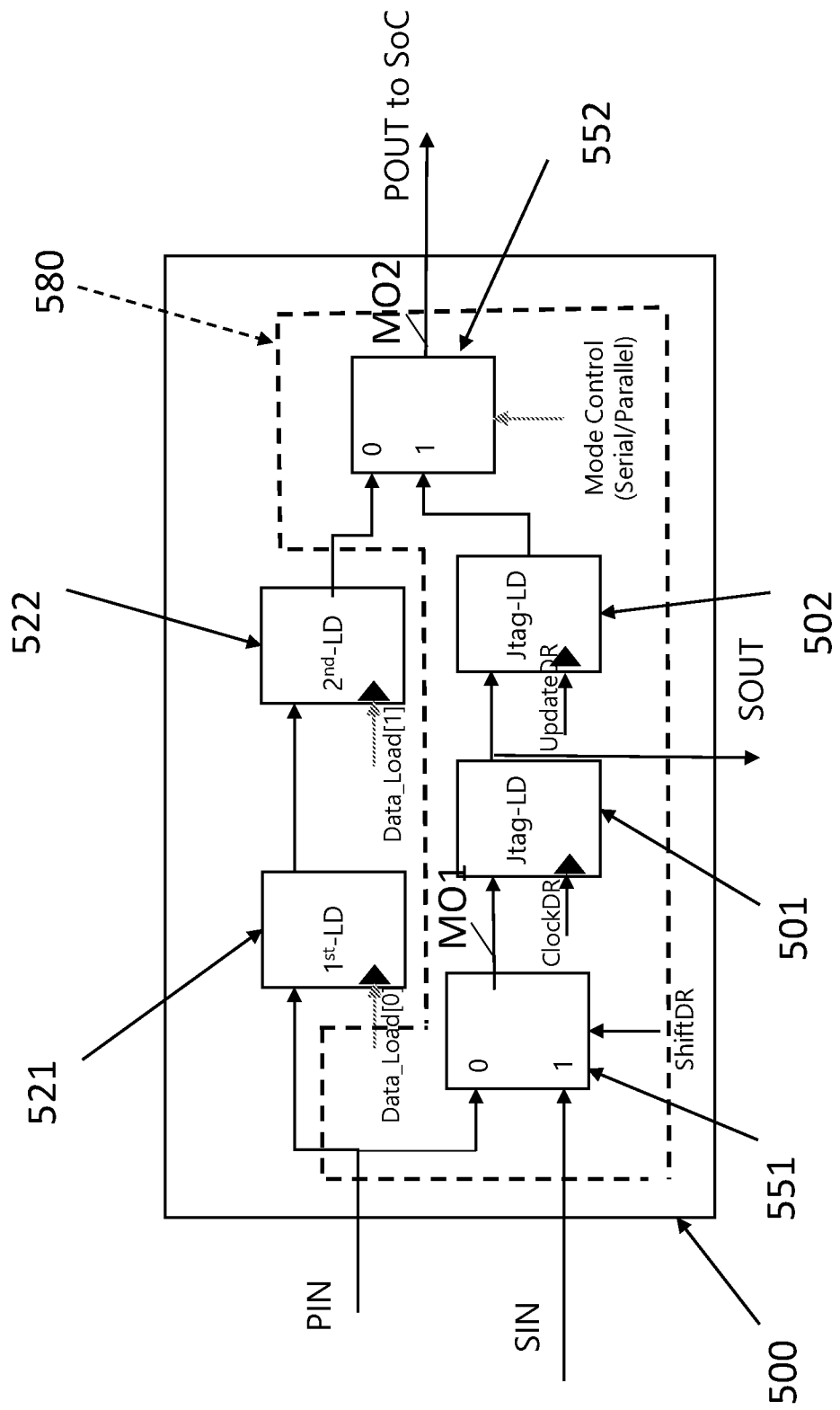
FIG. 5 is a schematic view of JTAG cell that has been modified according to the present disclosure.

Making reference to the schematic example of FIG. 5 it is shown a JTAG cell 500 modified according to the present disclosure.

As shown in FIG. 5 the JTAG cell 500 may be considered a functional element with two input terminals PIN and SIN and two output terminals POUT and SOUT. The input terminal PIN is a parallel input while the input terminal SIN is a serial input. Similarly, the output terminal POUT is a parallel output while the output terminal SOUT is a serial output.

The use of the scan-chain formed by the modified JTAG cells will output 256 bits, because a first reading phase is completed while a second one prepared in the background. When including the safety data, the modified JTAG cells will output 256 bits for data, 32 bits for address cells and 48 bits for ECC cells.

By using the "capture" state of the FSM and TAP controller and the Shift command on the captured content a testing process may be performed to check that no fault connection is present between the memory component 1 and the associated System-on-chip 10. Thanks to the parallel input and output the same JTAG cell is used as data buffer for the completing the reading phase through the sense amplifiers SA.

The JTAG cell 500 comprises a boundary scan basic cell 580 including a couple of latches 501 and 502 and a couple of multiplexer 551 and 552. A first input multiplexer 551 and a second output multiplexer 552.

The boundary scan basic cell 580 is indicated by the dotted line box in FIG. 5 and is a two inputs cell, with a serial input corresponding to SIN and parallel input corresponding to PIN, and two outputs cell with a serial output corresponding to SOUT and a parallel output corresponding to POUT.

The first multiplexer 551 receives on a first input "0" a parallel input signal Pin from the first parallel input terminal PIN and on a second input "1" as serial input signal Sin from the first serial input terminal SIN.

This first multiplexer 551 is driven by a control signal ShiftDR and has an outputs, MO1. The cell 500 has an output MO2 corresponding to the output of the second multiplexer 552 and to the parallel output POUT.

Figure 8:
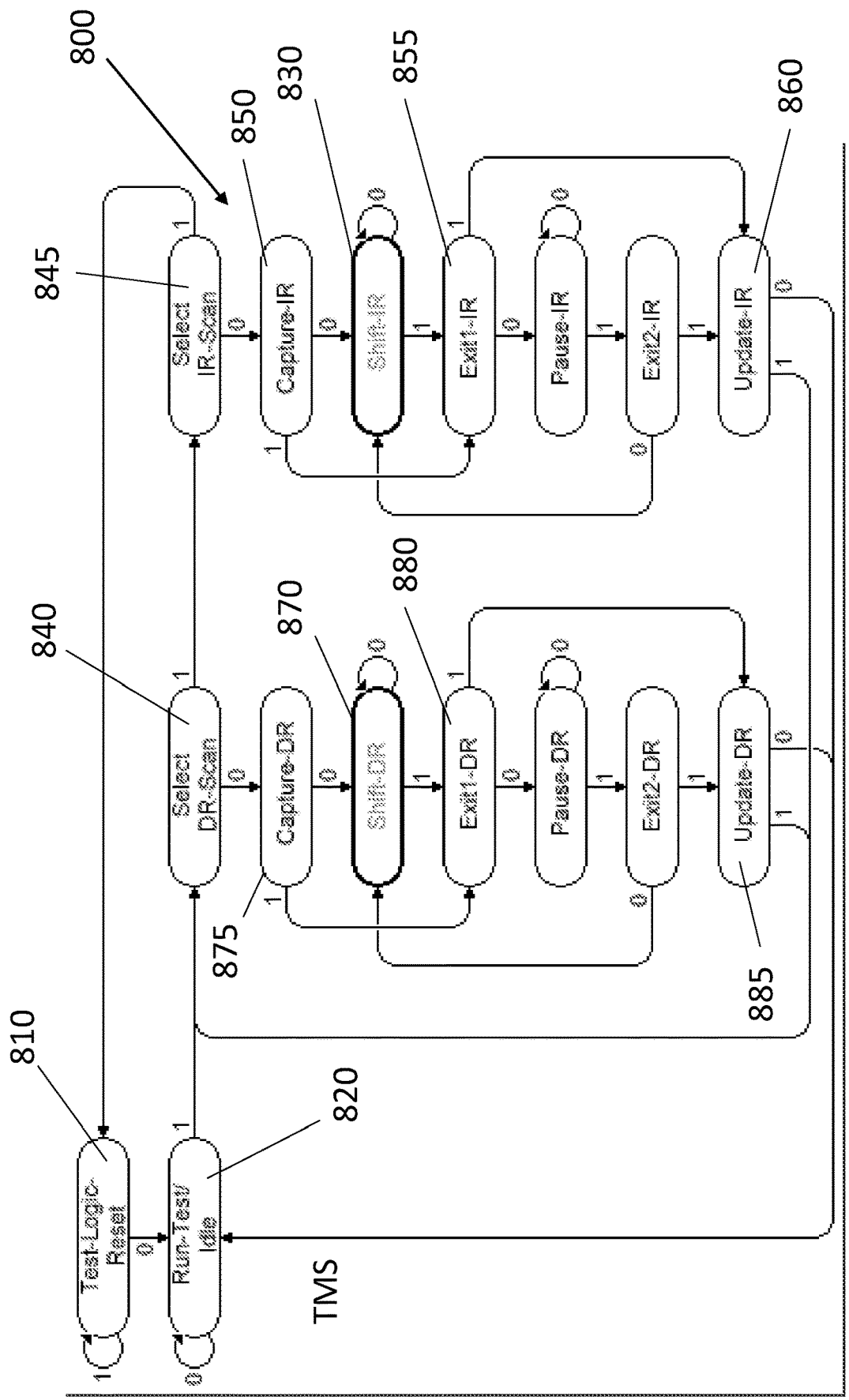
FIG. 8 is a block diagram reporting the operations of a Finite State Machine based on the JTAG protocol.

FIG. 8 shows a block diagram reporting the operations of a Finite State Machine based on the JTAG protocol.

This output MO1 is connected to a first input of the first latch or flip-flop 501 that receives on a second input terminal a clock signal ClockDR.

The first latch 501 is connected in chain to the second latch 502 with a first output of the first latch 501 connected to a first input of the second latch 502.

It is important to note that the output of the first latch 501 is also the serial output SOUT of the whole JTAG cell 500.

A second input terminal of the second latch 502 received a signal UpdateDR.

The second latch 502 has an output connected to an input of the second multiplexer 552, in particular to its second input.

This second multiplexer 552 is controlled by a Mode Control signal that allows to switch the whole JTAG cell 500 from a serial to a parallel mode and viceversa.

In one embodiment of the present disclosure the JTAG cell 500 further includes another couple of latches 521 and 522 provided between the parallel input Pin and the second multiplexer 552. In other words, the JTAG cell 500 includes the boundary scan cell 580 and at least the further latches 521 and 522. This latches 521 and 522 are dedicated to both the direct read, i.e. the first 168 bits, and the shadow one, i.e. second part of the 2×168 page.

We will refer hereinafter to these further latches as a third latch 521 and a fourth latch 522. In other embodiments a longer chain of latches may be used and therefore the size of the super page (2×168 Bits in this example) depends on the depth of the latches or flip-plops in this path.

More particularly, the third latch 521 and the fourth latch 522 are connected in a small pipeline configuration with the third latch 521 receiving on a first input the parallel input signal Pin from the first parallel input terminal PIN and receiving on a second input a signal Data_Load[0] corresponding to a first data load.

The fourth latch 522 receives on a first input the output of the third latch 521 and receives on a second input a signal Data_Load[1] corresponding to a subsequent data load.

The output of the fourth latch 522 is connected to the first input "0" of the second multiplexer 552 that produces on its output terminal MO2 the output signal for the parallel output terminal POUT.

If compared to a conventional JTAG cell the JTAG cell 500 of the present disclosure may be considered a modified JTAG cell because of the presence of the two extra latches, the third and fourth latches 521 and 522, beside the presence of the boundary scan cell 580.

Now, we have to imagine that a JTAG cell 500 is coupled to the output of each sense amplifier SA of the memory sub-array 220. As usual, the memory array provides for a sense amplifier for each column of memory cells, as shown in FIG. 4.

In the embodiment of the present disclosure all the JTAG cells 500 coupled to the sense amplifiers of a memory sub-array are to be considered a data buffer for a page to be read; in the present implementation such a page includes at least onehundredandsixtyeight (168) Bits for the reading of a combined memory page at a time from the four sub arrays 220.

However, as previously reported, the communication channel between the memory component and the SoC structure may need up to 2×168 Bits at a time (i.e. two combined memory words) and the JTAG cell 500 has been modified just to duplicate the internal latches to be able to shift the first or higher portion of the 128 Bits of the data to be read with the second or lower portion of the data to be read. Obviously, in this contest "higher" means the data portion that is loaded before while "lower" means the data portion that is loaded after.

A skilled in this art will understand that the number of internal latches of the modified JTAG cell 500 can be augmented in case of need to improve the number of Bits to be transferred to the SoC structure through the communication channel. For example, the above structure may be expanded according to size of the page required by the particular implementation of the controller the memory device.

Just to explain the manner in which data are transferred in the data buffer we have to imagine that when a data is loaded in the one of the two latches 521 or 522, the other latch is in a stand-by state but ready to receive the subsequent data portion.

Therefore, the first section including 168 Bit is transferred to the SoC structure for a first data elaboration while the reading phase is not stopped since the other portion of 128 Bits are prepared to be loaded into the latches at the subsequent clock signal.

Each data buffers contains 128 modified JTAG cells 500 and the common Data_Load[1:0] are signals generated to allow to capture the whole 256 Bits, that is to say: eight double words DWs according to the proposed implementation (eight double words for each sub arrays). More particularly, the common Data_Load[1:0] signals with a proper logic can be used as reading signals from the SoC to receive the whole 2×168 bits, including the safety data.

The signal generation is internally controlled in the sense that the SoC provides only a signal or a command to provide the second part of the super page while the internal read is handled by the read Finite State Machine in the flash array using a 168 Bits parallelism.

In this memory architecture each buffer can contain the whole super page thus leaving free the sense amplifier to read in another memory location.

The presence of the modified JTAG cell 500 is particular important as output of the sense amplifiers since allows:
  a. Using the boundary scan as method to check the interconnection between the SoC 10 and the Flash Array component 1;
  b. Implementing the Direct Memory Access connecting directly the sense amplifier with the controller;
  c. preparing, by the sense amplifier, the second 256 bit wide page plus the address plus the ECC and written close to the page.

Figure 6:
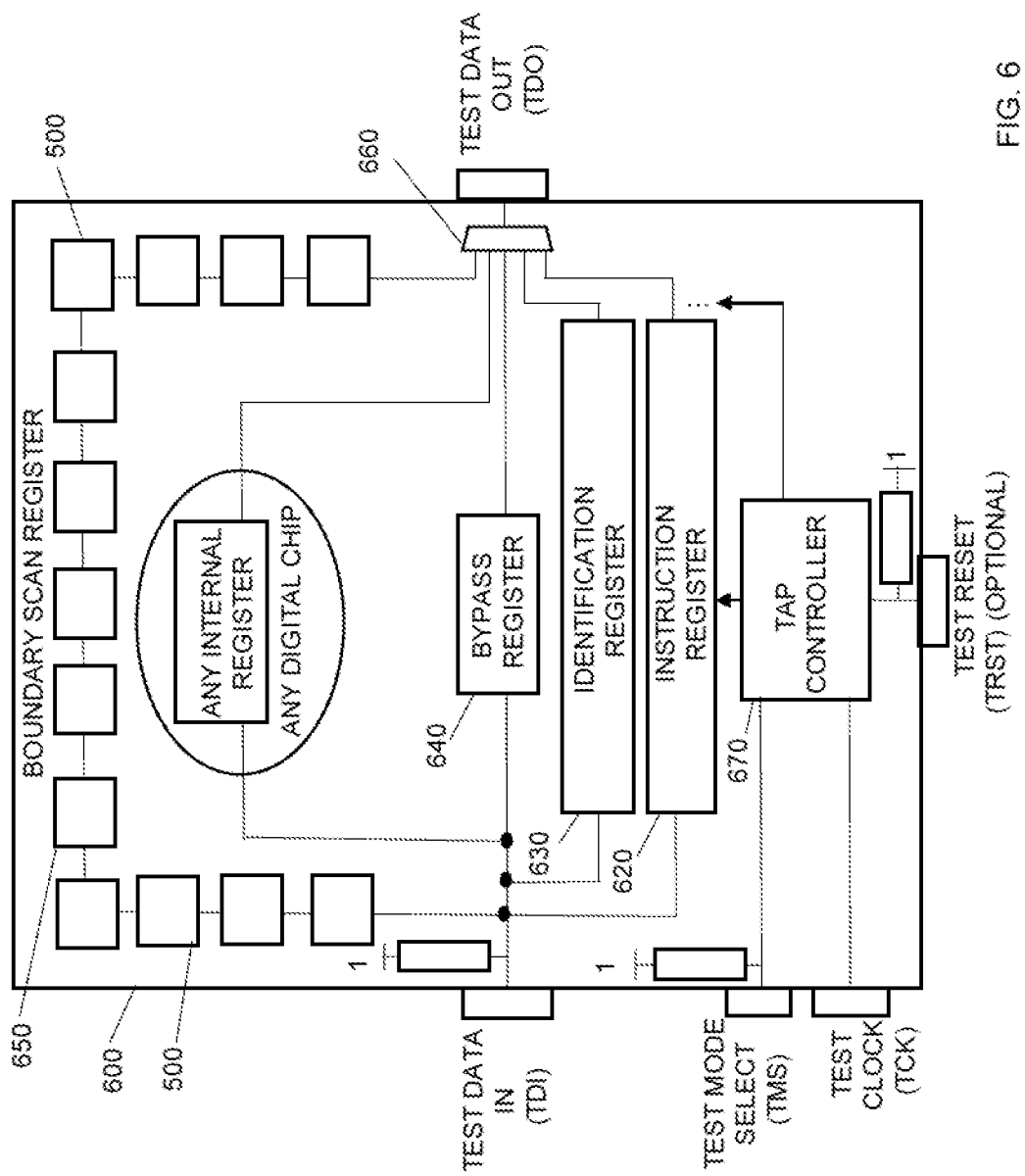
FIG. 6 is a schematic view of a standard structure architecture using boundary-scan cell configured according to the IEEE standard No. 1149.1 but including the modified JTAG cells of FIG. 5.

It is further possible to adopt a boundary-scan test architecture according to the IEEE 1149 standard but including modified JTAG cells 500 thus obtaining a new and peculiar boundary-scan test architecture like the one shown in the schematic view of FIG. 6. For this test it is needed only one output driven. This is done using the TCK signal and the data stored in the cells. As reported previously, the scan chain test requires the SoC 10 to test the output of the scan chain.

As it is known in this specific technical field, boundary scan is a family of test methodologies aiming at resolving many test problems: from chip level to system level, from logic cores to interconnects between cores, and from digital circuits to analog or mixed-mode circuits.

The boundary-scan test architecture 600 provides a means to test interconnections between the integrated circuits 1 and 10 on a board without using physical test probes. It adds a boundary-scan cell 500 that includes a multiplexer and latches, to each pin or pad on the device.

In other words, each primary input signal and primary output signal of a complex semiconductor device like the memory component 1 or the host device 10 is supplemented with a multi-purpose memory element called a boundary-scan cell that, altogether, form a serial shift register 650 around the boundary of the device.

Those boundary-scan cells have been introduced as a means of applying tests to individual semiconductor devices according to the result of the international work group known as Joint Test Action Group (JTAG).

According to the present disclosure the boundary-scan cells 500 are also used to test the interconnections between integrated circuits that work together such as the System-on-Chip 10 with the associated memory component 1, as is the case of the present disclosure.

The collection of boundary-scan cells is configured into a parallel-in or parallel-out shift register and the boundary-scan path is independent of the function of the hosting device. All the required digital logic is contained inside the boundary-scan register; however, the internal JTAG FSM of the Flash controller interacts with the cells through the JTAG protocol driven by the JTAG logic: i.e. through shiftDR, shiftIR, UpdateDR, etc.

To summarize very briefly the functioning of a boundary-scan cell it may be said that each cell 500 is structured for capturing data on its parallel input PI; updating data onto its parallel output PO; serially scanning data from its serial output SO to its neighbor's serial input SI. Moreover, each cell behaves transparently, in the sense that PI passes to PO.

FIG. 6 shows a schematic view of a standard structure architecture using boundary-scan cells configured according to the IEEE standard No. 1149.1. However, according to the present disclosure, the boundary-scan cells used in the architecture 600 are the modified JTAG cells 500 previously disclosed.

A JTAG interface 210 may considered a special interface added to the Flash array since according to the present disclosure two or more pins have added allowing this JTAG interface 210 to handle in parallel the JTAG registers. In other words, the added pins are not expanding the JTAG functionality but provides a flexibile TDI that provides parallel inputs to the serial JTAG registers to optimize the performance The connector pins are: TDI (Test Data In); TDO (Test Data Out); TCK (Test Clock); TMS (Test Mode Select) and an optional TRST (Test Reset).

The TRST pin is an optional active-low reset to the test logic, usually asynchronous, but sometimes synchronous, depending on the chip. If the pin is not available, the test logic can be reset by switching to the reset state synchronously using the TMS that samples for instance five times, one time brings the FSM TAP in the test logic reset state. Note that resetting test logic doesn't necessarily imply resetting anything else. There are generally some processor-specific JTAG operations which can reset all or part of the chip being debugged.

Since only one data line is available, the protocol is serial; however, having provided a flexible TDI, this modifies the availability of the data line to a parallel protocol. The clock input is at the TCK pin. One bit of data is transferred in from TDI, and out to TDO at each TCK rising clock edge. Different instructions can be loaded. Instructions for typical ICs might read the chip ID, sample input pins, drive (or float) output pins, manipulate chip functions, or bypass (pipe TDI to TDO to logically shorten chains of multiple chips).

As with any clocked signal, data presented to TDI must be valid for some chip-specific Setup time before and Hold time after the relevant (here, rising) clock edge. TDO data is valid for some chip-specific time after the falling edge of TCK.

FIG. 6 shows a set of four dedicated test pins—Test Data In (TDI), Test Mode Select (TMS), Test Clock (TCK), Test Data Out (TDO)—and one optional test pin Test Reset (TRST).

These pins are collectively referred as a Test Access Port (TAP). However, the architecture 600 includes a finite-state machine, named TAP controller 670, with receives as inputs three signals: TCK, TMS, and TRST. The TAP controller 670 is a 16-state Finite State Machine FSM that controls each step of the operations of boundary scan architecture 600. Each instruction to be executed by the boundary scan architecture 600 is stored in the Instruction Register 620.

FIG. 6 shows a plurality of boundary-scan cells 500 on the device primary input and primary output pins. The cells 500 are connected internally to form a serial boundary-scan register 650. In other words, the modified JTAG cells 500 are used as building blocks of the boundary scan architecture 600.

Data can also be shifted around the boundary-scan shift register 650 in serial mode, starting from a dedicated device input pin called "Test Data In" (TDI) and terminating at a dedicated device output pin called "Test Data Out" (TDO) at the output of a multiplexer 660.

The test clock, TCK, is the TCK is selectively sent to each register depending on the TAP state and register selection.

The Instruction Register (IR) 620 includes n-bit (with n≥2) and is implemented for holding each current instruction.

The architecture includes also a 1-bit bypass register 640 (Bypass); an optional 32-bit Identification Register 630 (Ident), capable of being loaded with a permanent device identification code.

At any time, only one register can be connected from TDI to TDO (e.g., IR, Bypass, Boundary-scan, Ident, or even some appropriate register internal to the core logic). The selected register is identified by the decoded output of the IR. Certain instructions are mandatory, such as Extest (boundary-scan register selected), whereas others are optional, such as the Idcode instruction (Ident register selected).

As disclosed later with reference to FIG. 8, a parallel load operation is called a "capture" operation and causes signal values on device input pins to be loaded into input cells and signal values passing from the core logic to device output pins to be loaded into output cells. The capture operation uses the parallel input to capture the value in each cell of the selected register.

A parallel unload operation is called an "update" operation and causes signal values already present in the output scan cells to be passed out through the device output pins. Moreover, a PAUSE instruction permits to hold the data in the register even if it is not completed. The update operation freezes the content of the shift register so to maintain it stable.

Depending on the nature of the input scan cells, signal values already present in the input scan cells will be passed into the core logic.

Now, in one embodiment of the present disclosure the boundary-scan architecture 600 is completed with a further or additional register 780 that is specifically provided to manage the memory component 1. This additional register 780 is also definable by the user using the IEEE1532 protocol as in system programming standard.

Figure 7:
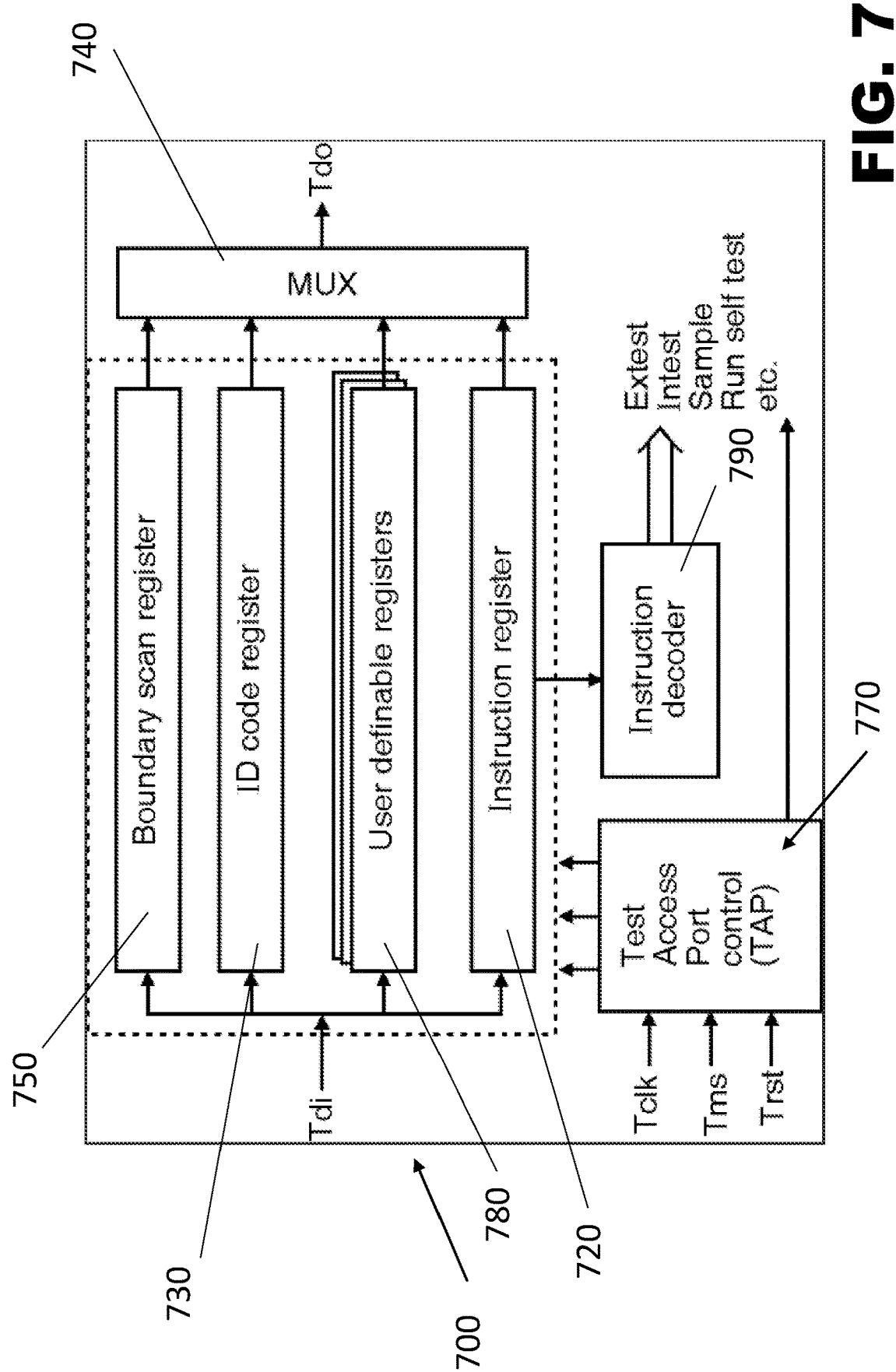
FIG. 7 is a diagram showing schematically in greater details the composition of registers incorporated into a boundary-scan architecture of the present disclosure.

FIG. 7 shows the boundary-scan architecture 700 that corresponds to the boundary-scan architecture 600 of FIG. 6 or to the boundary-scan architecture 260 in FIG. 2. The schematic representation of FIG. 7 illustrates just the mandatory registers as per IEEE1149 and introduces the users proprietary registers incorporated into the boundary-scan architecture 600 of the present disclosure; other component are missing not being relevant for the present disclosure.

In this FIG. 7 the boundary-scan shift register 750, corresponding to the boundary-scan register 650 of FIG. 6, is coupled to the TDI pin in serial mode and provides an output toward the TDO output pin via the multiplexer 760.

The test clock, TCK, is fed in via yet another dedicated device input pin and the mode of operation is controlled by a dedicated "Test Mode Select" (TMS) serial control signal both applied to the TAP controller 770.

The various control signals associated with the instruction are then provided by a decoder 790.

The Instruction Register (IR) 720 includes n-bit (with n≥2) and is implemented for holding each current instruction. The architecture includes a 1-bit bypass register (not shown in FIG. 7) and the Identification Register 730.

The additional register 780 is used as shift data register for allowing the interaction with the core of the host device in the writing and/or reading phases of the memory component. The user definable register can even be different. Depending on the command loaded in the IR, different register can be combined. For instance, to program the memory, it is necessary at least a data register with a size corresponding to the minimum page to be programmed in the memory array, a data address that contains which address can be loaded, optionally it may be necessary also a mask register to avoid to touch a portion of the data.

Now, the command user interface represented by the TAP controller 670 or 770 is based on the IEEE1149 and IEEE1532 standards (using the interface of IEEE1149), that implement a low signal count interface, i.e. TMS, TCK, TDI, TDO, TRST (Optional) with capability to modify the internal content of the associated memory sub array 220.

As shown in FIG. 8, the standard IEEE1149.1 is based on a finite state machine, i.e. including sixteen states, and two of them, i.e. shift instruction register (ShiftIR) and shift data register (ShiftDR), allows the interaction with the system in write and/or read.

FIG. 8 shows schematically the Test Access Port TAP 800 as a Finite State Machine taking care of all the operations concerning the testing of an integrated circuit such as a memory device.

The sequence of logic signals "0" and "1" applied to the TMS pin controls the operation of the chip architecture through the boundary scan structure.

Let's first consider to start from the test logic reset state indicated with the number 810 when the circuit is powered up. In this specific state all the boundary scan cells are in a so-called transparent condition with the parallel input PIN connected internally to the parallel output POUT and all the input pins are connected to the core of the integrated circuit.

By driving an appropriate sequence of logic values "1" and "0" as TMS signal it is possible to set the output multiplexer in such a manner that the TDI input is shifted as the first instruction to obtain the output TDO. The TMS signal should drive the TAP FSM in state ShiftDR or ShiftIR to connect the TDI and the TDO to a register To shift an instruction we need to go to the state ShiftIR with number 830 and to reach that state we need to apply the following sequence: setting 0 as TMS and driving several clock pulses to TCK we reach the Run/Idle state 820.

Selecting now a "1" from the state 820, being maintained for two clock cycles, we pass to a selection of a Data Register scan 840 and to an Instruction Register scan 845. In other words, TMS="1" is sampled twice. With a further "0" on the TMS we can reach the Capture phase of the Instruction Register 850.

The capture phase allows catching to two final Bits of the Instruction Register 720 in FIG. 7; this capture phase captures the value of the signals linked to the selected register. More particularly, in the case of the instruction register, the value 1 and 0 are hard coded, so not connected to anything.

A further "0" drives to the Shift IR that allows to pass the input value TDI to the output TDO; according to a JTAG implementation, the TDI value at the input appears after a number of clocks equal to register size. Using the flexible TDI, only one clock cycle would suffice, except the IR that must be minimum two clock cycles.

Keeping the TMS to "0" we may remain in the Shift IR state 830 allowing to shift the bits received on the TDI pin to the output TDO.

It is possible to remain in that state 830 for all the clock cycle needed to shift all the input bits.

We remain in the ShiftIR state 830 for a number of clock cycle corresponding to the number of bits of the IR 720 minus one. At the end of the sequence the Exit-1 IR state 855 is reached.

From this exit state 855 we will move to an update state 860 driving a "1" TMS and this is the moment when the new instruction become valid. The boundary scan cells are reverted to test mode wherein the input pins are isolated from the core circuitry.

It is now possible to send the test vector to the core circuitry by reaching the Shift DR state 870.

The states of the Data Register are similar to the states of the Instruction Registers.

Therefore, with the sequence 1-0-0 we can reach the ShiftDR state 870.

Passing through the Capture DR 875 the first multiplexer MO1 of the boundary scan cell is connected to the parallel input PIN and all the input pins of the boundary scan register have captured their input value.

Going now to the Shift DR 870 the multiplexer changes its state allowing to catch the serial input SIN and the scan path is shifted from the TDI input through the boundary scan register to the output pin TDO.

The circuit remains in this state for a number of clock cycle corresponding to the number of boundary scan cells minus one; obviously, the boundary scan is one of the possible data register selected with a proper instruction in the IR register.

The new test vector comes out to the output pins when the Exit-1 DR 880 state is passed and the Update DR state 885 is reached.

The sequence is repeated going from update to capture to allow a new test vector to be introduced into the circuitry.

As we have seen, the TAP includes test data input and test data output and a clock signal. More particularly, the shift data register ShiftDR reports a state where the TDI is connected with a register. In that state the register content is transferred in and/or out of the device.

Similarly, the shift instruction register ShiftIR also reports a state where the TDI is connected with a register. Instruction are loaded in that state.

Due to the requirement of having multiple core inside the host device 10, the internal register 780 of the JTAG interface must be able to support up to address and data registers. In particular, the generation of four address registers (one from each sub-array 220) is provided to be filled with a different address for each sub array 220 and triggering four different data out for the read register [0:3], per sub-array section. The communication to the SoC happens connecting the selected Read Register, i.e. the output named POUT [127:0], directly to input of the channel of the host device or SoC 10.

This mechanism allows to pre-load the data for the controller, reducing the latency time to a very low value.

For completeness sake, it should be noted that the JTAG state machine can be used to reset a register, to access an instruction register, or to access the data selected by the instruction register.

JTAG platforms often add signals to the handful defined by the IEEE 1149.1 specification. A System Reset (SRST) signal is quite common, letting debuggers reset the whole system, not just the parts with JTAG support. Sometimes there are event signals used to trigger activity by the host or by the device being monitored through JTAG; or, perhaps, additional control lines.

In JTAG, devices expose one or more test access ports (TAPs).

To use JTAG, a host is connected to the target's JTAG signals (TMS, TCK, TDI, TDO, etc.) through some kind of JTAG adapter, which may need to handle issues like level shifting and galvanic isolation. The adapter connects to the host using some interface such as USB, PCI, Ethernet, and so forth. However, according to the present disclosure the SoC is capable to drive the JTAG TAP in the memory also without external aid.

The host device 10 communicates with the TAPs by manipulating the signals TMS and TCK (or also TRST if present). The signal TDI is used only to load register data reading then the results through TDO (which is the only standard host-side input). TMS/TDI/TCK output transitions create the basic JTAG communication primitive on which higher layer protocols build:

State switching: wherein all TAPs are in the same state, and that state changes on TCK transitions. All the TAP FSM are moving accordingly because the TMS is connected at the same time to all the JTAG compliant devices, fi they are present in the board.

As shown in FIG. 8, this JTAG state machine is part of the JTAG specification and includes sixteen states. There are six "stable states" where keeping TMS stable prevents the state from changing. In all other states, TCK always changes that state. In addition, asserting the signal TRST forces entry, thus bringing to the default value all the content of the registers. Their content is not anymore valid and it should be reloaded to one of those stable states (Test_Logic_Reset) in a slightly quicker way than the alternative of holding TMS high and cycling TCK five times.

Shifting phase: wherein most parts of the JTAG state machine support two stable states used to transfer data. Each TAP has an instruction register (IR) and a data register (DR). The size of those registers varies between TAPs, and those registers are combined through TDI and TDO to form a large shift register. (The size of the DR is a function of the value in that TAP's current IR, and possibly of the value specified by a SCAN_N instruction.)

Usually there is a optional register to define the size of the data registers. The IR is checked using the standard since the low significant bits are loaded with 1 and 0. This allows to count the number of jtag devices in the network and having knowledge of the size of each TAP IR, that can be different.

There are three operations defined on that shift register:
Capturing a temporary value.
Entry to the Shift_IR stable state goes via the Capture_IR state, loading the shift register with a partially fixed value (not the current instruction)
Entry to the Shift_DR stable state goes via the Capture_DR state, loading the value of the Data Register specified by the TAP's current IR.
Shifting that value bit-by-bit, in either the Shift_IR or Shift_DR stable state; TCK transitions shift the shift register one bit, from TDI towards TDO, exactly like a SPI mode 1 data transfer through a daisy chain of devices (with TMS=0 acting like the chip select signal, TDI as MOSI, etc.).
Updating IR or DR from the temporary value shifted in, on transition through the Update_IR or Update_DR state. The PAUSE state is also relevant as part of the standard in each side of the shift branch.

Running state: wherein one stable state is called Run_Test/Idle. The distinction is TAP-specific. Clocking TCK in the Idle state has no particular side effect, but clocking it in the Run_Test state may change system state. For example, some cores support a debugging mode where TCK cycles in the Run_Test state drive the instruction pipeline.

So, at a basic level, using JTAG involves reading and writing instructions and their associated data registers; and sometimes involves running a number of test cycles. Behind those registers is hardware that is not specified by JTAG, and which has its own states that is affected by JTAG activities.

JTAG Finite State Machine is triggered at the rising edge of the TCK, the clock signal and provides output at the falling edge. This allows to use the bypass register and not losing clock cycles in the scan-chain.

The TMS signal is checked and its value triggers the state transition.

The ShiftDR and ShiftIR state are addressing IO registers and the TDI signal is used to serial insert data inside the selected register The IR Register is used to select the specific data register and/or the instruction to be used.

When the state machine is in run-test/idle, the IR register is checked for a command and it is executed, using the data of eventual service registers, i.e. a program command can use the data register and the address register to decide what and where the data must be stored.

JTAG boundary scan technology provides access to many logic signals of a complex integrated circuit, including the device pins. The signals are represented in the boundary scan register (BSR) accessible via the TAP. This permits testing as well as controlling the states of the signals for testing and debugging. Therefore, both software and hardware (manufacturing) faults may be located and an operating device may be monitored.

The present disclosure obtains many advantages reported hereinafter not in order of importance. The solution previously disclosed reduces the cost of the silicon for the memory component and improve the overall quality and reliability issues for the whole apparatus including the host device and memory component.

The apparatus of the present disclosure offers a good option for realizing Real Time Operative Systems (RTOS), especially in the Automotive segment, providing a low initial latency in the first access of the memory component.

Moreover, the memory architecture previously disclosed provides for a very high quality and an error rate in the range of less than 1 part per million.

Finally, the disclosed architecture allows adopting an aggressive lithography node in the host device and the latest flash memory technology in the memory component decoupling both technologies allowing to realize the best integrated circuit for both devices in place.

The memory component 1 and the host or SoC 10 have been coupled with an interface using a very high parallelism. This feature can be used also to improve the performance, for instance to load the Instruction Register and the (generic) Data Registers.

Figure 9:
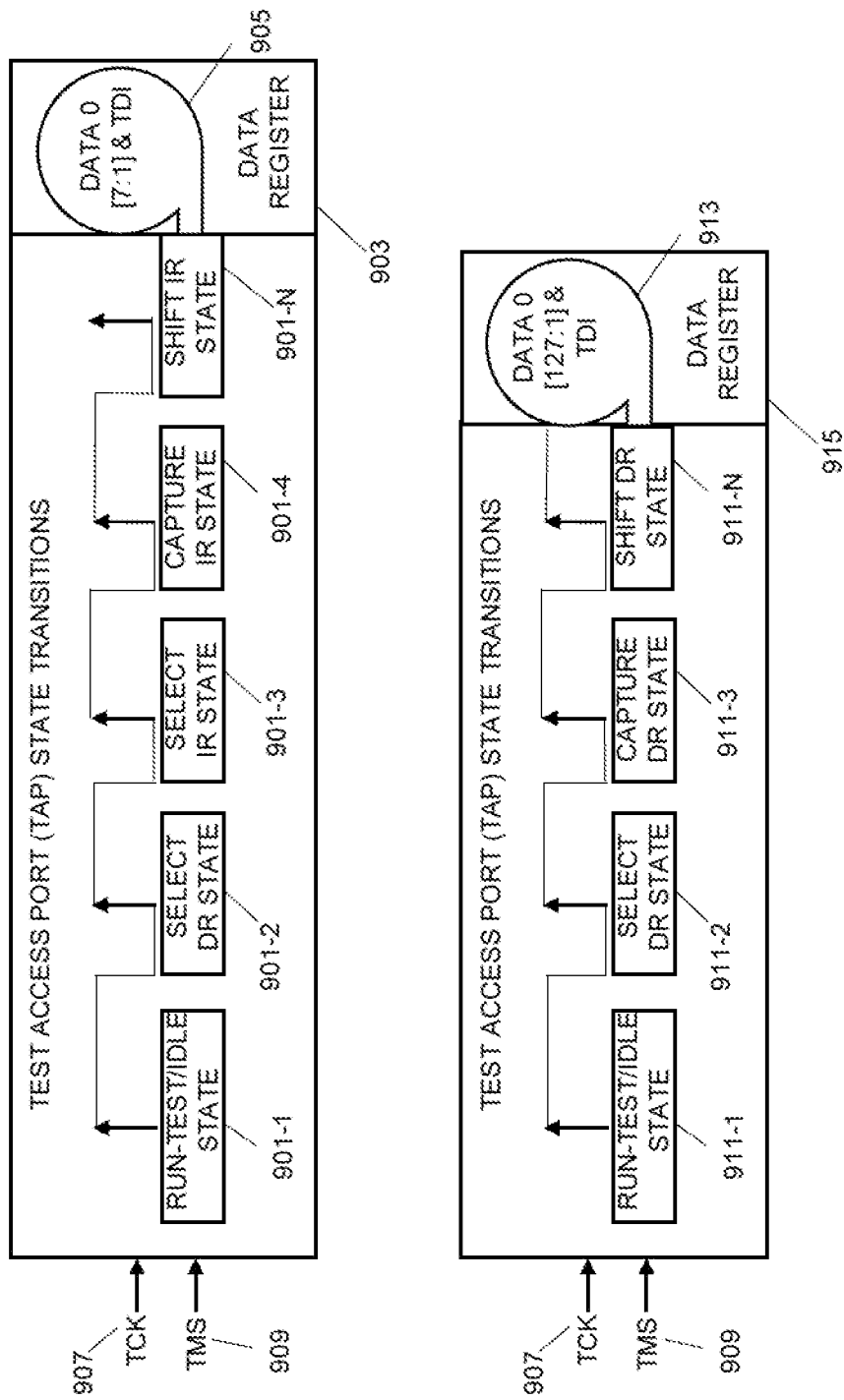
FIG. 9 is a schematic view of a list of instructions based on a Finite State Machine based on the JTAG protocol.

For instance, if we make reference to the example of FIG. 9, it may be appreciated that the instruction register 720 can be loaded in a single clock cycle connecting in parallel the DATAx to the memory cells.

Moreover, FIG. 9 is showing the TAP transitions, driven by the TMS signal (even if not shown). When the state ShiftDR or ShiftIR are reached; the figure shows two cases of flexible TDI, one data register of eight bits and another data register of 128 Bits or 168 Bits when including the safety data address and ECC bits.

The Data0 can be used as default, but in case that the SoC 10 cannot manage the single DAT0 for all the communication a mux can be added for each channel of the controller, i.e. when the channel0 is addressed DATA0, when channel1 Data1, etc.

The Data0 can load in parallel all the sub-array read registers in case of concurrent programming.

The IEEE 1149 defines a serial protocol. The Instruction Register 720 of at least two bits is used also as discovery method.

Figure 10:
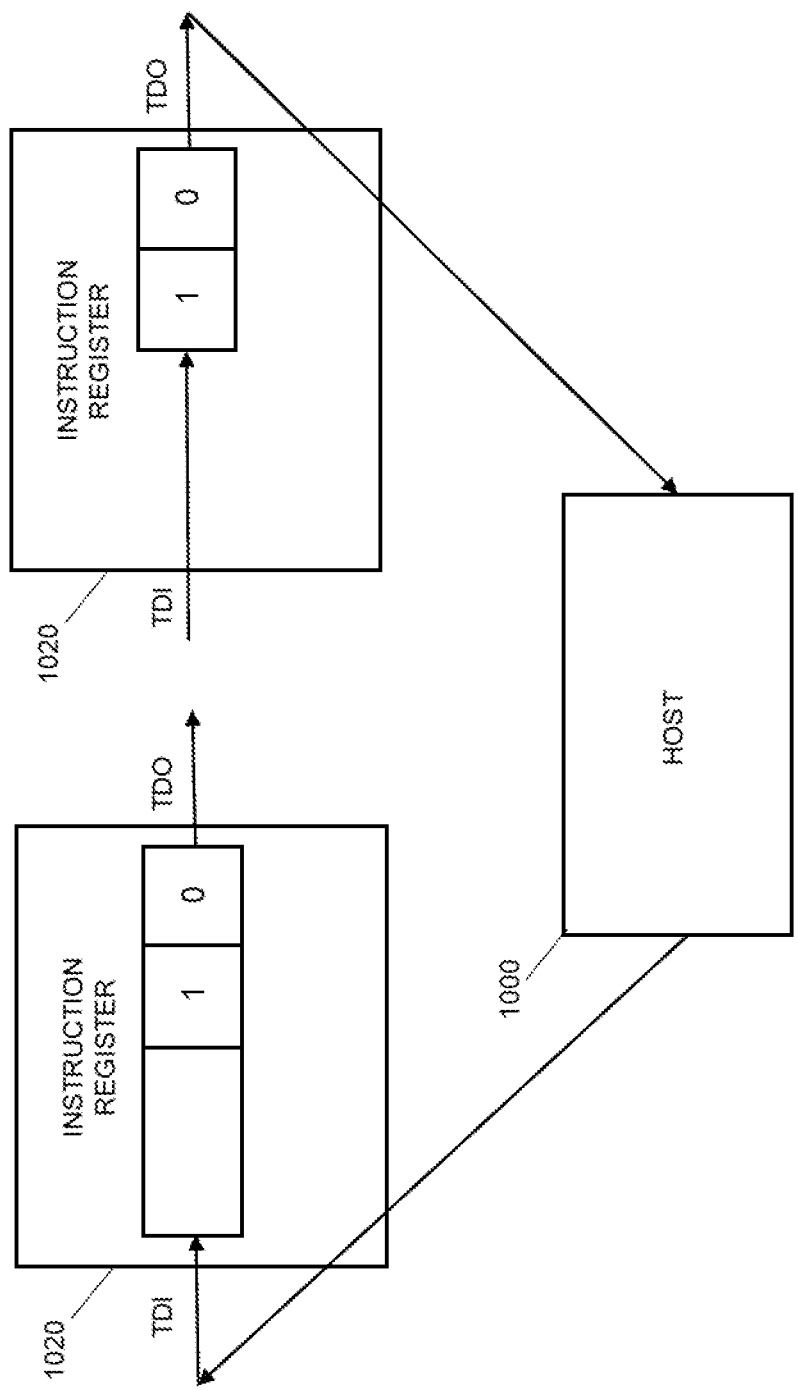
FIG. 10 is a block diagram showing schematically the interaction between the host device of FIG. 1 and a register of the boundary-scan architecture of the present disclosure.

Making now reference to the schematic example of FIG. 10, it is shown a relationship between the host device or System-on-Chip 10, indicated with the number 1000 in FIG. 10, and the instruction register 1020 corresponding to the instruction register 720 of FIG. 7.

The host 1000 can move the interfaces of all the devices connected to the scan chain to the ShiftIR mode and, then, start to shift in a known codeword, when the whole serial chain is passed the codeword appears to the TDO of the host. It should be remarked that the TMS, TCK and TRST are common signals, the serial connection shortening the TDO of a device with the TDO of an adjacent device in the scan chain. Moreover, the TDI of the host is connected with the first TDI of the scan chain, while the TDO as received by the host is the TDO of the last device in the scan chain.

The host can count the combination "1 0" shown in the left side of the FIG. 10 and obtains the following information:
number of devices in the chain; and/or
length of the Instruction register of each device.

The flexible TDI was thought to improve the performance of certain operation, i.e. a data register containing 168 bits can be loaded using the whole DATA I/O capability of the sub-array. The output will be always compatible with the JTAG, but it will be only one bit, i.e. the less significant bit of the data register.

The instruction register requires a specific attention, because it must be at least 2 bits wide, so in the case that the Instruction Register is 8 bit, the implementation of the flash array mu forecast a communication using two clock cycles, to allow the sequence "1 0" to be sent to the next device.

The proposed methodology would not be the default state of the device, but it will be selectable in a volatile configuration register bit, so that the user can configure the device to operate in Flexible TDI all the times it is required.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

The invention claimed is:

1. An apparatus, comprising:
a host device;
a memory component coupled to the host device and comprising:
an array of memory cells; and
an interface comprising a boundary scan architecture, wherein the boundary scan architecture includes an instruction register configured to store data indicative of a presence of a test data input (TDI) signal; and
wherein the array of memory cells comprises a plurality of sub arrays each comprising:
a plurality of blocks of memory cells; and
a plurality of independently addressable extended pages in each block, each extended page including a group of data bits, address bits, and ECC bits.

2. The apparatus of claim 1, wherein the boundary scan architecture includes boundary scan cells compliant with the IEEE standard 1149.1.

3. The apparatus of claim 2, wherein the boundary scan cells each comprise at least 3 latches.

4. The apparatus of claim 2, wherein the boundary scan cells each comprise four latches.

5. The apparatus of claim 1, wherein the interface comprises a finite state machine (FSM) configured to load the instruction register in a single clock cycle.

6. The apparatus of claim 5, wherein the memory component comprises a data register configured to be loaded in parallel with the instruction register.

7. The apparatus of claim 1, wherein the boundary scan architecture comprises a plurality of boundary scan cells, with the plurality of boundary scan cells being coupled to respective sense amplifier outputs.

8. The apparatus of claim 1, wherein the memory component comprises an array of Flash memory cells.

9. The apparatus of claim 1, wherein the host device comprises a system on a chip (SoC).

10. The apparatus of claim 1, wherein the instruction register is configured to store at least two bits of data indicative of a data register to be selected.

11. A memory component, comprising:
an array of memory cells; and
an interface comprising a boundary scan architecture configured to receive a test data input (TDI) signal from a host device, wherein the boundary scan architecture includes an instruction register configured to receive data indicative of a presence of the TDI signal and data from memory cells of the array; and
wherein the array of memory cells comprises a plurality of sub arrays each comprising:
a plurality of blocks of memory cells; and
a plurality of independently addressable extended pages in each block, each extended page including a group of data bits, address bits, and ECC bits.

12. The memory component of claim 11, wherein the data indicative of the presence of the TDI signal and the data from memory cells of the array are received in parallel by the instruction register.

13. The memory component of claim 12, wherein the data indicative of the presence of the TDI signal and the data from memory cells of the array are received in a single clock cycle.

14. The memory component of claim 11, wherein the host device is a system on a chip (SoC).

15. The memory component of claim 11, wherein the boundary scan architecture comprises a plurality of boundary scan cells each receiving an input from a respective sense amplifier coupled to the array of memory cells.

16. The memory component of claim 11, wherein the instruction register is further configured to receive data indicative of a data register to be selected.

17. A system, comprising:
a host device; and
a memory component coupled to the host device and comprising:
an array of memory cells; and
an interface comprising a boundary scan architecture that includes an instruction register configured to receive, in parallel:
data indicative of a presence of a test data input (TDI) signal from the host device; and
data from memory cells of the array.

18. The system of claim 17, wherein the host device is coupled to the memory component via a bus.

19. The system of claim 18, wherein the boundary scan architecture comprises a plurality of boundary scan cells, with the plurality of boundary scan cells being coupled to respective sense amplifier outputs and each comprising at least four latches.

* * * * *